(12) United States Patent
Okabe et al.

(10) Patent No.: US 6,815,125 B1
(45) Date of Patent: Nov. 9, 2004

(54) COLOR FILTER AND PROCESS FOR PRODUCING THE SAME

(75) Inventors: Masato Okabe, Tokyo-to (JP); Hironori Kobayashi, Tokyo-to (JP); Manabu Yamamoto, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 106 days.

(21) Appl. No.: 09/607,010

(22) Filed: Jun. 29, 2000

(30) Foreign Application Priority Data

Jun. 30, 1999 (JP) .......................................... P11-186704
Oct. 1, 1999 (JP) .......................................... P11-281520

(51) Int. Cl.$^7$ .......................... G02B 5/20; G02F 1/1335
(52) U.S. Cl. ............................. 430/7; 347/106; 349/106
(58) Field of Search ............................. 430/7; 347/106, 347/107; 349/106

(56) References Cited

U.S. PATENT DOCUMENTS

| | | | | |
|---|---|---|---|---|
| 5,817,441 A | * | 10/1998 | Iwata et al. | 430/7 |
| 5,908,721 A | * | 6/1999 | Emoto et al. | 430/7 |
| 6,294,313 B1 | * | 9/2001 | Kobayashi et al. | 430/302 |
| 6,399,257 B1 | * | 6/2002 | Shirota et al. | 430/7 |

FOREIGN PATENT DOCUMENTS

| | | | |
|---|---|---|---|
| EP | 0 665 449 A | * | 8/1995 |
| JP | 5975205 | | 4/1984 |
| JP | 8227012 | | 9/1996 |
| JP | 8230314 | | 9/1996 |
| JP | 9131914 | | 5/1997 |
| JP | 9203803 | | 8/1997 |
| JP | 10133631 | | 5/1998 |
| JP | 1138226 | | 2/1999 |
| JP | 11078271 | | 3/1999 |
| JP | 1191255 | | 4/1999 |
| JP | 11105234 | | 4/1999 |
| JP | 11109610 | | 4/1999 |
| JP | 11115334 | | 4/1999 |
| JP | 11115335 | | 4/1999 |
| JP | 11123804 | | 5/1999 |
| JP | 11123805 | | 5/1999 |
| JP | 11123806 | | 5/1999 |
| JP | 11123807 | | 5/1999 |
| JP | 11133631 | | 5/1999 |
| JP | 11138970 | | 5/1999 |
| JP | 11138971 | | 5/1999 |
| JP | 11143055 | | 5/1999 |
| JP | 11147360 | | 6/1999 |
| JP | 11208134 | | 8/1999 |
| JP | 11245533 | | 9/1999 |
| JP | 11249287 | | 9/1999 |
| JP | 11258860 | | 9/1999 |
| WO | WO99/08158 | * | 2/1999 |

\* cited by examiner

*Primary Examiner*—John A. McPherson
(74) *Attorney, Agent, or Firm*—Ladas & Parry LLP

(57) ABSTRACT

There is provided a color filter without a shading part, which comprises a transparent substrate, a picture element part provided on the transparent substrate by the predetermined pattern of a plurality of colors with an ink jet system, and a wettability-variable layer, in which the wettability can be changed, provided for forming the picture element part.

21 Claims, 7 Drawing Sheets

COLOR FILTER AND PROCESS FOR PRODUCING THE SAME

BACKGROUND OF THE INVENTION

The present invention relates to a color filter which is obtained by coloring a picture element part with an ink jet system and which is suitable for a color liquid crystal display and a process for producing the same.

Recently, there has been a tendency that a demand for a liquid crystal display, particularly a color liquid crystal display is increasing with the development of a personal computer, particularly a portable personal computer. However, since this color liquid crystal display is expensive, a demand for the cost-cut is getting higher and, in particular, a demand for the cost-cut of a color filter weighing in a respect of cost is high.

In such a color filter, a liquid crystal usually operates as a shutter by equipping with three primary colors of red (R), green (G) and blue (B) and switching ON and OFF of an electrode corresponding to each picture element part of R, G and B and the color display is performed by transmission of the light through each picture element part of R, G and B.

As a process for producing a color filter which has hitherto been carried out, there is, for example, a dyeing process. In this dyeing process, a water-soluble polymer material which is a material for dyeing is first formed on a glass substrate, which is patterned into the desired shape by a photolithography step and the resulting pattern is dipped into a dyeing bath to obtain a colored pattern. This is repeated three times to form a color filter layer consisting of picture element parts of R, G and B.

Alternatively, as an another method, there is a pigment dispersing method (color resist method). In this method, a photosensitive resin layer in which a pigment is dispersed is first formed on a substrate and this is subjected to patterning to obtain a monocolor pattern. Further, this step is repeated three times to form a color filter layer consist of picture element parts of R, G and B.

As a still another method, there are an electrode position method and a method of dispersing a pigment in a thermosetting resin and performing three times printing of R, G and B and, thereafter, thermally curing the resin. However, in any method, the same step needs to be repeated three times for coloring three colors of R, G and B, and there is a problem that the cost is high and a yield is decreased because of repetition of a step.

As a process for producing a color filter which has solved these problems, there is proposed a method of blowing a coloring ink with an ink jet system to form a colored layer (picture element part) (JP-A-59-75205). In the publication, there are disclosed a method in which a convex part which is a border is printed in advance with a material having the worse wettability on an ink when an ink having the better wettability on a glass substrate is used, and a method in which a pattern is formed in advance with a material having the better wettability on an ink to help the ink fixation when an ink having the worse wettability on a glass is used. However, there is no description regarding how to specifically coat a material having the better wettability and a material having the worse wettability.

On the other hand, as another process for producing a color filter by blowing a coloring ink by an ink jet system to form a colored layer (picture element part), there is disclosed a method of treating a concave part with an inkphilic treating agent in JP-A-9-203803. In this method, a convex part is formed in advance on a substrate and this convex part is made to be ink-repellent and, thereafter, the whole substrate is surface-treated with the inkphilic treating agent. However, in this method, since a convex part needs to be ink-repellent in advance upon the inkphilic treatment, there is a problem that two times treatments of the ink-repulsion treatment and the inkphilic treatment need to be performed.

In addition, as a method for producing a color filter by forming a colored layer with an ink jet system, there is described a method of forming a colored layer (picture element part) by providing an ink absorbing layer on a substrate and making a difference in the ink absorbability of this absorbing layer between an exposed part and an unexposed part in JP-A-8-230314 and JP-A-8-227012. However, in this method, since a colored layer is formed by forming an absorbing layer and absorbing an ink in this absorbing layer, there is a problem that a difference in the coloration between a central part of an ink dot and a surrounding part of that is present which results in the color nonuniformity. In addition, there is also a problem that this absorbing layer needs the predetermined thickness resulted from its function of absorbing an ink.

On the other hand, in a color filter, a shading part called as a black matrix is generally provided on a boundary portion of a picture element part. The shading part generally formed on the side of color filter. However, in case of using as a liquid crystal panel, there are some cases that the shading part is formed on the side of a substrate opposite to the color filter. When the shading part is formed on the side of a substrate opposite to the color filter, a color filter in which a shading part is not provided, is formed. The above-described problems also occur in the color filter which do not has a shading part.

The present invention was done in view of the above problems and a main object thereof is to provide a color filter which do not have a shading part, in which a part having the better wettability and a part having the worse wettability can be formed on a single layer regarding the wettability of a substrate which becomes problematic upon formation of a picture element part with an ink jet system, and a pattern formed of the part having the better wettability and the part having the worse wettability can be formed in a few steps and, further, an ink absorbing layer is not necessary, and which has the better quality and which can be produced with the low cost, and a process for producing the same.

SUMMARY OF THE INVENTION

In order to attain the aforementioned object, the present invention provides a color filter which comprises a transparent substrate, a picture element part in which a plurality of colors are provided in the predetermined pattern with an ink jet system on the transparent substrate, and a wettability-variable layer being capable of varying the wettability which is provided for forming the picture element part.

As described above, the present invention is characterized in that it has a wettability-variable layer in order to form a picture element part. Therefore, by utilizing the change in the wettability of a wettability-variable layer, a picture element part can be formed with the better precision, and a high quality color filter having no problem such as color missing and color nonuniformity can be provided.

In this case, the construction may be such that the wettability-variable layer is provided on the transparent substrate, and the picture element part is provided on the wettability-variable layer. By forming such a construction, a wettability-variable layer of a part on which a picture element part is formed can be made to be an inkphilic region having a small contact angle with a liquid in advance, and the other part of the wettability-variable layer can be made to be an ink-repellent region having a large contact angle with a liquid. By coloring the inkphilic region where the picture element part is formed, with an ink jet system, an ink is adhered to only the inkphilic region having a small contact angle with a liquid. Accordingly, the ink is applied uniformly within the whole surface of the picture element part. Therefore, a color filter having no disadvantage such as color nonuniformity and color missing can be provided.

In the present invention, it is preferable that a space (distance) between the picture element parts is not more than 2 μm. Since a color filter of the present invention does not have a black matrix (shading part), when actually using for a liquid crystal panel, it is necessary to use together with a back light side substrate having a black-matrix. In this case, when a space between picture element parts is wide, it is necessary to have a high precision concerning positioning with the back light side substrate which has a black matrix. If it is not so, a back light penetrates the space between the picture element parts, as a result, the so-called color missing may occur. Accordingly, it is preferable that the space between the picture element parts is as small as possible, concretely, it is preferable that the space between the picture element parts is not more than 2 μm. Further, a colored layer consisting of the picture element parts can obtain surface smoothness if the space between the picture element parts is small like that.

In the present invention, an ink-repellent convex part may be formed on a surface of a wettability-variable layer at a boundary portion of the picture element part. Since an ink-repellent convex part is formed on a boundary portion between the picture element parts forming portions when the picture element part is formed by adhering an ink with an ink jet system, the disadvantages such as mixing of inks during coloring, do not occur, being preferable.

On the other hand, in the present invention, the construction may be such that the picture element part is provided on the transparent substrate, and the wettability-variable layer is provided on a border portion between the picture element parts.

In this case, by making the wettability of a wettability-variable layer on a border part of a picture element part, an ink-repellent region having the larger contact angle with a liquid than that of a part on a transparent substrate, on which a picture element part is to be formed, since it is difficult for an ink to migrate over a border part of a picture element part having ink-repellent properties upon coloring a part on which a picture element part is to be provided (picture element part forming portion) with an ink jet system, a color filter having no disadvantages such as ink mixing and the like can be provided. In addition, by making a wettability-variable layer of a border part of a picture element part an inkphilic region having the small contact angle with a liquid thereafter, covering the whole with a protecting layer can be easily carried out and, thus, a color filter having the high quality can be obtained.

In this case, it is preferable that the wettability on the transparent substrate is less than 10 degrees in terms of the contact angle with a liquid having the surface tension of 40 mN/m. This is because, when an ink is adhered to the picture element part forming portion on the transparent substrate with an ink jet system, the ink for the picture element part is uniformly spread with a picture element part forming portion, the better-quality color filter having no disadvantages such as color nonuniformity and the like can be provided.

In the present invention, it is preferable that the wettability-variable layer is a photocatalyst-containing layer comprising at least a photocatalyst and a binder, and having the wettability which varies so that the contact angle with a liquid is decreased by irradiation with the energy.

Like this, by forming a photocatalyst-containing layer having the wettability which varies so, that the contact angle with a liquid is decreased by irradiation with the energy, the wettability of this layer can be varied by performing the pattern irradiation of the energy and the like and an inkphilic region having the small contact angle with a liquid can be formed easily and, for example, it becomes possible to easily make only a part on which a picture element part is formed into an inkphilic region. Accordingly, when a shading part is not provided between the picture element parts, the picture element part can be easily formed, and a color filter without a shading port can be manufactured effectively.

In a color filter described above, it is preferable that the photocatalyst-containing layer contains fluorine and the photocatalyst-containing layer is formed so that the content of fluorine on the surface of the photocatalyst-containing layer is decreased by the action of the photocatalyst as compared with before the irradiation of the energy upon irradiating the photocatalyst-containing layer with the energy.

As mentioned above, since a color filter of the present invention is constructed such that the fluorine content of the energy irradiated part on a photocatalyst-containing layer formed on a transparent substrate is decreased, a pattern comprising a part in which the fluorine content is decreased can be formed by the pattern-irradiation of the energy. Since when the fluorine content is decreased, the part becomes a region having the high inkphilicity as compared with other parts, it becomes possible to easily make only a part on which a picture element part and the like is formed an inkphilic region, and a color filter can be easily manufactured.

Further, in a color filter described above, it is preferable that the fluorine content of a part in which the fluorine content is decreased by irradiating the photocatalyst-containing layer with the energy, is 10 or less relative to 100 of the fluorine content of a part which was not irradiated with the energy.

When, like this, the fluorine content of a part having the lower fluorine content which was formed by irradiating the photocatalyst-containing layer with the energy, is 10 or less based on the weight relative to 100 of the fluorine content of a part which is not irradiated with the energy, a great difference in the inkphilicity between a part irradiated with the energy and a part not irradiated with the energy can be produced. Therefore, by forming a picture element part and the like on a photocatalyst-containing layer on which such the pattern is formed, it becomes possible to precisely form a picture element part and the like on only an inkphilic region having the reduced fluorine content and a color filter can be manufactured with the better precision.

The photocatalyst comprised in the photocatalyst-containing layer, is preferably one or more selected from the group consisting of titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$). Inter alia, titanium oxide ($TiO_2$) is preferable. This is because since titanium oxide has the high band gap energy, it is effective as a photocatalyst, is chemically stable, has no toxicity and is easily available.

In the case of a color filter in which a photocatalyst is titanium oxide, it is preferable that it has a photocatalyst-containing layer in which fluorine element is contained in the surface of the photocatalyst-containing layer at an amount of 500 or more relative to 100 of titanium element as quantified by a X-ray photoelectron spectroscopic method.

This is because, when such the degree of fluorine (F) element is contained, the ink-repellent properties of a part not irradiated with the energy are sufficient and, when a pattern of a part having the reduced fluorine (F) element content by the energy irradiation is formed and a picture element part and the like are formed thereon, an ink and the like do not drop out into a part other than a part on which a picture element part is formed and a color filter can be manufactured more precisely.

On the other hand, in a color filter described above, a binder which is the other component constituting a photocatalyst-containing layer is preferably organopolysiloxane having a fluoroalkyl group.

The reasons are as follows. In a color filter of the present invention, as a method of inclusion of fluorine element in a photocatalyst-containing layer, mention may be made of various methods. However, by using organopolysiloxane having a fluoroalkyl group as a binder, fluorine element can be easily contained in a photocatalyst-containing layer and the content thereof can be easily reduced by the energy irradiation.

In addition, in a color filter described above, it is preferable that a binder which is the other component constituting a photocatalyst-containing layer, is formed of organopolysiloxane which is one or more of a hydrolyzed condensed compound or a co-hydrolyzed condensed compound of a silicon compound represented by $Y_nSiX_{(4-n)}$ (wherein Y represents alkyl group, fluoroalkyl group, vinyl group, amino group, phenyl group or epoxy group, X represents alkoxy group or halogen, and n is an integer of 0 to 3).

In a color filter described above, it is preferable that a silicon compound having a fluoroalkyl group among the aforementioned silicon compounds constituting the aforementioned organopolysiloxane is contained at an amount of not less than 0.01 mol %.

The reasons are as follows. When a silicon compound having a fluoroalkyl group is contained at an amount of not less than 0.01 mol %, fluorine element is sufficiently contained in the surface of a photocatalyst-containing layer and it is possible to make larger the difference in the wettability between an inkphilic region on a photocatalyst-containing layer having the reduced fluorine element content resulted from the energy irradiation and an ink-repellent region on the surface of a photocatalyst-containing layer not irradiated with the energy. Accordingly, an ink and the like can be precisely attached into an ink-repellent region without dropping out upon formation of a picture element part and the like on an inkphilic region, and a color filter having the better quality can be manufactured.

In the present invention, it is preferable that the contact angle with a liquid having the surface tension of 40 mN/m on the photocatalyst-containing layer is 10 degrees or more in a part not irradiated with the energy and the angle is less than 10 degrees in a part irradiated with the energy. Since a part not irradiated with the energy is a part requiring the ink-repellent properties, when the contact angle with a liquid having the surface tension of 40 mN/m is less than 10 degrees, the ink-repellent properties are not sufficient and there is a possibility that an ink and a coating material for a shading part and the like remain, being not preferable. On the other hand, when the contact angle of a part irradiated with the energy with a liquid having the surface tension of 40 mN/m is 10 degrees or more, there is a possibility that the spread of an ink and a coating material for a shading part is inferior, color missing and the like may occur in a picture element part.

Further, in the present invention, it is preferable that a picture element part colored with the aforementioned ink jet system is a picture element part colored with an ink jet system using an UV-curing ink. This is because, after a picture element part is colored with an ink jet system by using an-UV curing ink, UV is irradiated and, thereby, an ink can be rapidly cured, which can be sent to a next step, being preferable in a respect of the efficiency.

A liquid crystal panel having the aforementioned color filter and a opposite substrate having a shading part, and which is obtained by encapsulating a liquid crystal compound between both substrates, has the advantages of the aforementioned color filter, that is, the advantages that color missing and color nonuniformity of a picture element part are not present and it is advantageous in a respect of cost.

In order to attain the aforementioned object, the present invention provides a process for production of a color filter, which comprises steps: (1) a step of providing a photocatalyst-containing layer having the wettability of the energy-Irradiated part which changes in a direction of reduction of the contact angle with a liquid, on a transparent substrate, (2) a step of forming an exposed part for a picture element part by pattern-irradiating with the energy on a picture element part forming portion on which the picture element part, on the photocatalyst-containing layer formed on the transparent substrate, is to be formed, and (3) a step of coloring the exposed part for a picture element part with an ink jet system, to form a picture element part.

In a process for producing a color filter in the present invention, by providing a photocatalyst-containing layer on a transparent substrate and irradiating this photocatalyst-containing layer with the energy, an exposed part for a picture element part, on which the contact angle with a liquid of the energy-irradiated part is reduced, can be formed. By coloring the exposed part for a picture element part with an ink jet system, the picture element part can be easily formed. Accordingly, it is possible to form the picture element part with the ink jet system with advantageous in a respect of cost even if there is no shading part on the transparent substrate.

Further, in the present invention, the step of forming an exposed part for a picture element part, then coloring the part with an ink jet system to form the picture element part, may comprise steps; (a) a step of forming a exposed part for a first picture element part by pattern-irradiating with the energy on a part of a picture element part forming portion on which the picture element part, on the photocatalyst-containing layer, is to be formed, (b) a step of forming a first picture element part by coloring the exposed part for a first picture element part with the ink jet system, (c) a step of forming a exposed part for a second picture element part by irradiating with the energy on a remaining part of a picture element part forming portion on which the picture element part, on the photocatalyst-containing layer, is to be formed, and (d) a step of forming a second picture element part by coloring the exposed part for a second picture element part with the ink jet system.

When a picture element part is formed on a transparent substrate without a shading part, it is not possible to use the shading part as a partition during coloring a picture element part. Therefore, in case of forming a picture element part through coloring a exposed part for a picture element part converted to inkphilic region by irradiating with the energy, and when a space between the exposed parts for a picture element part is narrow, that is, when a width of an ink-repellent region not exposed is narrow, there are some possibilities of mixing some sorts of ink for adjacent picture element parts through migration over an ink-repellent region during forming a picture element part. Accordingly, it is desirable to form adjacent picture element parts as apart as possible during formation of the picture element part. As described above, when the method such that the second picture element part is formed after the first picture element part is formed, is employed, the adjacent picture element parts can be formed on apart positions each other during formation of the first picture element part because the energy can be pattern-irradiated such that the picture element part is formed alternately during formation of the first picture element part. Since the exposed part for a first picture element part is formed the condition such that relatively wide ink-repellent region exist between the colored regions, like that, and is colored with an ink jet system, there is no possibility of mixing some sorts of ink for adjacent picture element parts. Then, the exposed part for a second picture element part is formed though exposing again between the first picture element parts formed like that, and then is colored with the ink jet system, as a result a color filter which do not have deficiency such as ink mixing, can be obtained. Further, concerning a color filter which do not have a shading part, there are some demands such that no space exist between picture element parts. In this case, it is necessary to employ the method such that the formation of picture element parts divides into two times, described above.

In the present invention, an exposed part for an ink-repellent convex part where an ink-repellent convex part is to be formed, may be formed before formation of the exposed part for a picture element part, and then an ink-repellent convex part may be formed on the exposed part for an ink-repellent convex part through using resin composition. By forming an ink-repellent convex part like this, for example, when the ink-repellent convex part is formed around the region where a picture element part is to be formed, it is possible to prevent the problem such that a picture element part can not be formed precisely because ink flows out at the portion around a color filter. In this invention, particularly, it is preferable to form the ink-repellent convex part between the picture element parts. It is the reason to do so that the above mentioned problem, that is, mixing some sorts of ink for adjacent picture element parts, become hardly to occur.

Further, the present invention provides a process for production of a color filter, which comprises steps: (1) a step of providing a photocatalyst-containing layer having the wettability of the energy-irradiated part which changes in a direction of reduction of the contact angle with a liquid, at a boundary portion of a picture element part forming portion on which the picture element part is to be formed, on a transparent substrate, (2) a step of forming the picture element part on the picture element part forming portion on the transparent substrate.

According to this method, first, a photocatalyst-containing layer is provided at the boundary portion of the picture element part on the transparent substrate. When the material which has larger contact angle with a liquid before irradiating the energy than that of a surface of the transparent substrate, is employed to the photocatalyst-containing layer, the picture element part forming portion is an inkphilic region which has smaller contact angle with a liquid than that of the boundary portion on which the photocatalyst-containing layer is formed. Accordingly, the boundary portion of the picture element part forming portion acts as an ink-repellent region. Thus, when ink is adhered to the picture element part forming portion which is an inkphilic region, with an ink jet system in the next step, the adhered ink does not migrate beyond the boundary portion which acts as an ink-repellent region. Hence, it is difficult to generate the problem such as ink mixing during formation of a color filter.

Further, in this case, it is preferable that the wettability on the transparent substrate is less than 10 degrees as a contact angle with a liquid having the surface tension of 40 mN/m. Since the wettability of the surface of the transparent substrate is inkphilic, an ink is uniformly and evenly spread when an ink is adhered on a transparent substrate with an ink jet system. Thus, color missing and color nonuniformity do not generate, and a color filter having the high quality can be obtained.

DETAILED DESCRIPTION OF THE PREFERRED EMBODIMENTS

The present invention will be explained in detail and a color filter is first explained and, then, a process for producing a color filter is explained.

A. Color Filter

First, the color filter according to the present invention is explained. The color filter according to the present invention comprises a transparent substrate, a picture element part in which a plurality of colors are provided in the predetermined pattern with an ink jet system on the transparent substrate, and a wettability-variable layer being capable of varying the wettability which is provided for forming the picture element part.

The present invention has a wettability-variable layer in order to form a picture element part as described above. Therefore, since a picture element part can be easily formed by varying the wettability of a wettability-variable layer, a color filter having the high quality can be obtained at the low cost. "In order to form a picture element part" herein includes the meaning that a picture element part is positioned on a transparent substrate.

The color filter according to the present invention, having such the wettability-variable layer is explained in detail below by means of some embodiments.

1. The First Embodiment

The first embodiment of the present invention is a color filter in which the picture element part is provided on the predetermined portion on the wettability-variable layer which is formed on the transparent substrate. This shows an example of a color filter in which a picture element part is positioned through a wettability-variable layer.

In the present embodiment, a picture element part is provided on a wettability-variable layer being capable of varying the wettability in a color filter without a shading part. Therefore, the wettability of a part on which a picture element part is to be provided in advance can be made into an inkphilic region having the small contact angle with a liquid and the other part can be made into an ink-repellent region having the large contact angle with a liquid. Since an ink is adhered to only an inkphilic region having the small contact angle with a liquid by coloring the picture element part forming portion on which a picture element part is to be provided, with an inkjet system, in spite of a surface of a transparent substrate without a shading part, an ink is uniformly spread over the whole picture element part, and a region having no ink is not present and color nonuniformity and the like do not occur in a picture element part, and an ink is not adhered to the other ink-repellent region.

One example of the color filter according to the first embodiment like this is explained using some drawings.

Figure 1:
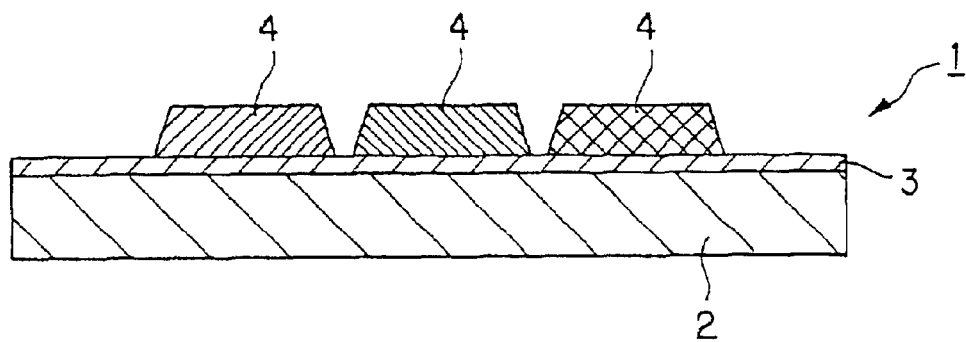
FIG. 1 is a schematic sectional view showing an example of the first embodiment of the color filter according to the present invention.

FIG. 1 shows one example of a color filter of the present embodiment. This color filter 1 comprises a wettability-variable layer 3 formed on a transparent substrate 2, and a picture element part 4 having three color parts of red(R), green(G), and blue(B) formed on the wettability-variable layer 3. In a color filter of the present embodiment, an protecting layer may be formed on the picture element part 4 as needed.

In a color filter of the present embodiment, it is preferable that a space between the picture element parts 4 is narrow. Since a color filter of the present embodiment is a type of color filter in which a black matrix (shading part) is not provided, when actually using for a liquid crystal display, it is necessary to use together with a back light side substrate having a black-matrix. In this case, when a space between the picture element parts is wide, it is necessary to have a high precision concerning positioning with the back light side substrate on which the black-matrix is provided. If it is not so, a back light penetrates the space between the picture element parts, as a result, the so-called color missing may occur so it is not preferable.

Further, there is an advantage such that a colored layer consisting of the picture element parts can be smoothness through that the space between the picture element parts is narrow like that. In the present embodiment, concretely, it is preferable that a distance between the picture element parts is not more than 2 μm, particularly, not more than 1 μm. If necessary, there may be no space between the picture element parts of the color filter in the present invention.

Figure 2:
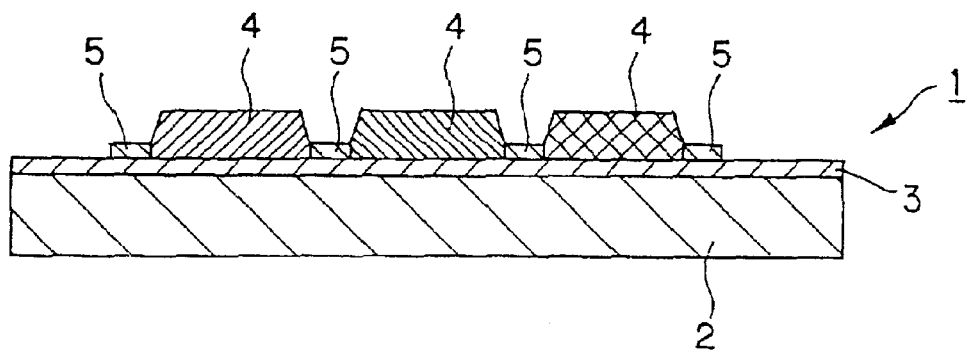
FIG. 2 is a schematic sectional view showing an another example of the first embodiment of the color filter according to the present invention.

FIG. 2 shows an another example of a color filter of the present embodiment. In this example, similar to the example showing in FIG. 1, a color filter comprises a wettability-variable layer 3 formed on a transparent substrate 2, and a picture element part 4 formed on the wettability-variable layer 3. Further, an ink-repellent convex part 5 which has an ink-repellent property, is formed on a portion between the picture element parts 4. Since an ink-repellent convex part 5 is formed in a color filter 1 of this example like this, an ink is not flown out over this ink-repellent convex part 5 upon adhering an ink to a picture element part forming portion with an ink jet system and, thus, a color filter having a picture element part which does not mix with an ink of an another color can be obtained.

Each part constituting such the color filter is explained below.

(Wettability-variable Layer)

The wettability-variable layer is not particularly limited so long as the wettability of the surface thereof can be varied by the external stimulation, for example, physical stimulation and chemical stimulation. For example, the layer may be a layer in which the state of roughness of the surface is varied by an acid, an alkali and the like and, whereby, the wettability is varied, or a layer in which a substance in the wettability-variable layer is changed by irradiation of the energy such as the ultraviolet light, the visible light and the heat and, whereby, the wettability is changed.

In addition, regarding the change in the wettability, the layer may be a wettability-variable layer in which a contact angle with a liquid is great before the addition of stimulation and a contact angle with a liquid is changed so that it becomes smaller after the addition of stimulation, or a wettability-variable layer in which a contact angle with a liquid is conversely small before the addition of stimulation and a contact angle with a liquid is greatly changed.

(Photocatalyst-containing Layer)

In the present invention, it is preferable that this wettability-variable layer is a photocatalyst-containing layer in which the wettability changes so that a contact angle with a liquid is reduced by the energy irradiation. The reasons are as follows. By providing a photocatalyst-containing layer in which the wettability changes so that a contact angle with a liquid is reduced by exposure (which means not only the light irradiation but also the energy irradiation in the present invention) like this, the photocatalyst-containing layer can be made into an inkphilic region having the small contact angle with a liquid by pattern-irradiating with the energy to easily change the wettability and, for example, only a part on which a picture element part is to be formed can be easily made into an inkphilic region. Therefore, a color filter can be manufactured effectively and it becomes advantageous in a respect of cost. In this case, it is preferable that the light including the ultraviolet ray is used as the energy.

An inkphilic region herein is a region having the small contact angle with a liquid and is intended to refer to a region having the better wettability relative to an ink for an ink jet, a coating material for a shading part and the like. In addition, an ink-repellent region is a region having the great contact angle with a liquid and is intended to refer to a region having the worse wettability relative to an ink for an ink jet, a coating material for a shading part and the like.

It is preferable that, in the photocatalyst-containing layer, a contact angle with a liquid having the surface tension of 40 mN/m is 10 degrees or more in a part not exposed, preferably a contact angle with a liquid having the surface tension of 30 mN/m is 10 degrees or more and, particularly, a contact angle with a liquid having the surface tension of 20 mN/m is 10 degrees or more. This is because, since a part not exposed is required to be ink-repellent in the present invention, when a contact angle with a liquid is small, the ink-repellent properties are not sufficient and there arises a possibility that an ink or a coating material for a shading part remains, being not preferable.

In addition, it is preferable that the photocatalyst-containing layer is a layer in which a contact angle with a liquid is reduced when exposed and a contact angle with a liquid having the surface tension of 40 mN/m becomes less than 10 degrees, preferably a contact angle with a liquid having the surface tension of 50 mN/m becomes 10 degrees or less and, particularly, a contact angle with a liquid having the surface tension of 60 mN/m becomes 10 degrees or less. When a contact angle with a liquid of an exposed part is high, there is a possibility that the spread of an ink or a coating material for a shading part in this part is inferior and color missing or the like occurs in a picture element part.

A contact angle with a liquid herein is obtained from the results by measuring a contact angle with liquids having various surface tensions using a contact angle measuring apparatus (type CA-Z manufactured by Kyowa Interface science Co., Ltd.) (after 30 seconds from dropping a droplet from a microsyringe) or making a graph from the results. In addition, as liquids having various surface tensions upon this measurement, the wettability index standard solutions manufactured by Junsei Science Co., Ltd. can be used.

It is preferable that a photocatalyst-containing layer in the present invention comprises at least a photocatalyst and a binder. By adopting such the layer, it becomes possible to make the critical surface tension higher by the action of the energy irradiation and a contact angle with a liquid can be reduced.

Although the action mechanism of a photocatalyst representing titanium oxide described below in such the photocatalyst-containing layer is not necessarily clear, it is considered that a carrier produced by the light irradiation has influences on the chemical structure of organic substances by the direct reaction with an adjacent compound or active oxygen species in the presence of oxygen and water.

When a photocatalyst-containing layer is used as a wettability-variable layer in the present invention, the layer can be made into inkphilic by changing the wettability of an exposed part using the action of oxidation, degradation and the like of an organic group which is a portion of a binder or additives with a photocatalyst and, whereby, there can be arisen the great difference in the wettability between an exposed part and an unexposed part. Hence, by enhancing the acceptability (inkphilicity) and the repellent properties (ink-repellent properties) with a coating material for a shading part or an ink of an ink jet system, a color filter having the better quality and which is also advantageous in a respect of cost can be obtained.

In addition, when such the photocatalyst-containing layer is used in the present invention, the photocatalyst-containing layer may be formed such that it contains at least a photocatalyst and fluorine and further the content of fluorine in the surface of this photocatalyst-containing layer is reduced with the aforementioned action of a photocatalyst as compared with before the energy irradiation upon irradiating the photocatalyst-containing layer with the energy.

In a color filter having such the characteristics, a pattern comprising a part having the small content of fluorine can be easily formed by pattern-irradiating with the energy. Here, fluorine has the extremely low surface energy and, for this reason, the surface of a substance having a large amount of fluorine becomes smaller in the critical surface tension. Therefore, the critical surface tension of a part containing a small amount of fluorine becomes greater as compared with the critical surface tension of the surface of a part containing a great amount of fluorine. This means that a part containing a small amount of fluorine becomes an inkphilic region as compared with a part containing a great amount of fluorine. Hence, the formation of a pattern comprising a part having a small amount of fluorine as compared with the surrounding surface results in the formation of an inkphilic region pattern in an ink-repellent region.

Therefore, when such the photocatalyst-containing layer is used, since the pattern of an inkphilic region can be easily formed within an ink-repellent region by pattern-irradiation of the energy, it becomes possible to easily form a picture element part and the like in only this inkphilic region and a color filter having the better quality can be obtained.

It Is preferable that, regarding the content of fluorine contained in a photocatalyst-containing layer containing fluorine as described above, the content of fluorine in an inkphilic region having the lower content of fluorine which was formed by the energy irradiation is 10 or less, preferably 5 or less, particularly preferably 1 or less when the fluorine content in a part not irradiated with the energy is 100.

The reasons are as follows. By selecting the fluorine content in such the range, it is possible to produce the great difference In the inkphilic properties between the energy-irradiated part and the energy-unirradiated part. Therefore, by forming a picture element part and the like on such the photocatalyst-containing layer, it becomes possible to precisely form a picture element part and the like in only an inkphilic region having the reduced fluorine content and a color filter can be obtained with the better precision. This rate of reduction is based on weight.

Various methods which are generally performed can be used to measure the fluorine content in such the photocatalyst-containing layer and, for example, a method which can quantitatively measure the fluorine amount in the surface such as X-ray Photoelectron Spectroscopy, also called as ESCA (Electron Spectroscopy for Chemical Analysis), fluorescent X-ray analysis, and mass spectroscopy can be used, being not limiting.

As a photocatalyst used in the present invention, mention may be made of photosemiconductors such as titanium oxide ($TiO_2$), zinc oxide (ZnO), tin oxide ($SnO_2$), strontium titanate ($SrTiO_3$), tungten oxide ($WO_3$), bismuth oxide ($Bi_2O_3$), and iron oxide ($Fe_2O_3$). One or more may be selected from them and mixed for use.

In the present invention, particularly, titanium oxide is suitably used because titanium oxide has the high band gap energy, is chemically stable and not toxic, and can be obtained easily. There are two types of titanium oxide, anatase and rutile. Although both can be used in the present invention, anatase-type titanium oxide is preferable. Anatase-type titanium oxide has the excitation wavelength of not greater than 380 nm.

As such the anatase-type titanium oxide, mention may be made of hydrochloric acid-deflocculated-type anatase-type titania sol (STS-02 (average particle size 7 nm) manufactured by Ishihara Sangyo Kaisha, LTD., ST-KO1 manufactured by Ishihara Sangyo Kaisha, LTD.), and nitric acid-deflocculated-type anatase-type titania sol (TA-15 (average particle size 12 nm) manufactured by Nissan Chemical Industries, Ltd.).

The small particle size of a photocatalyst is preferable because the photocatalystic reaction occurs effectively. The average particle size of 50 nm or less is preferable and it is particularly preferable to use a photocatalyst having the average particle size of not greater than 20 nm. As the particle size of a photocatalyst is smaller, the surface roughness of a photocatalyst-containing layer becomes smaller, being preferable. When the particle size of a photocatalyst exceeds 100 nm, the central line average surface roughness becomes larger, the ink-repellent properties of an unexposed part of a photocatalyst-containing layer are reduced and manifestation of the inkphilic properties of an exposed part becomes insufficient, being not preferable.

The color filter of the present invention may be a color filter obtained by incorporating fluorine in the surface of a photocatalyst-containing layer as described above, reducing the fluorine content in the surface of a photocatalyst-containing layer by pattern-irradiating the surface of this photocatalyst-containing layer with the energy and, thereby, forming the pattern of an inkphilic region in an ink-repellent region and forming a picture element part and the like thereon. Even in this case, titanium oxide is preferably used as a photocatalyst. The content of fluorine contained in a photocatalyst-containing layer when titanium oxide is used like this, is preferable such that fluorine (F) element is contained in the surface of a photocatalyst-containing layer at an amount of not less than 50, preferably not less than 800, particularly preferably 1200 relative to 100 of titanium (Ti) element as quantitatively determined by analyzing by X-ray photoelectron spectroscopy.

The reasons are as follows. Since it becomes possible to sufficiently reduce the critical surface tension in a photocatalyst-containing layer by inclusion of such a degree of fluorine (F) in a photocatalyst-containing layer, the ink-repellent properties in the surface can be retained and, thereby, the difference in the wettability between the ink-repellent region and an inkphilic region in the surface in the pattern part having the reduced fluorine content by the pattern-irradiation of the energy and the quality of the finally obtained color filter can be improved.

Further, in such the color filter, it is preferable that the fluorine content in an inkphilic region formed by the pattern irradiation of the energy is such that fluorine (F) element is contained at a rate of not greater than 50, preferably not greater than 20, particularly preferably not greater than 10 relative to 100 of titanium (Ti) element.

When the fluorine content in a photocatalyst-containing layer can be reduced to such the degree, the sufficient inkphilic properties can be obtained in order to form a picture element part and the like, it becomes possible to form a picture element part and the like with the better precision due to the difference in the wettability between the inkphilic region and the ink-repellent region not irradiated with the energy, and a color filter having the better quality can be obtained.

In the present invention, it is preferable that a binder used in a photocatalyst-containing layer has such the high binding energy that the principal chain is not degraded by the photoexcitation of the aforementioned photocatalyst, for example, mention may be made of (1) organopolysiloxane which exerts the great strength and which is obtained by hydrolyzing and polymerization-condensing chloro or alkoxysilane by a sol-gel reaction or the like, and (2) organopolysiloxane obtained by cross-linking reactive silicone having the excellent water-repellency and oil-repellency.

In the case of the aforementioned (1), organopolysiloxane which is obtained by hydrolyzing and condensing or co-hydrolyzing and condensing one or more of silicon compounds represented by the general formula:

$$Y_n SiX_{(4-n)}$$

(wherein Y represents alkyl group, fluoroalkyl group, vinyl group, amino group, phenyl group or epoxy group, X represents alkoxyl group, acetyl group or halogen, and n is an integer of 0 to 3). A number of carbon of a group denoted by Y is preferably in a range of 1 to 20 and alkoxyl group denoted by X is preferably methoxy group, ethoxy group, propoxy group, and butoxy group.

More particularly, there can be used methyltrichlorsilane, methyltribromsilane, methyltrimethoxysilane, methyltriethoxysilane, methyltriisopropoxysilane, methyltri-t-butoxysilane;

ethyltrichlotsilane, ethyltribromsilane, ethyltrimethoxysilane, ethyltriethoxysilane, ethyltriisopropoxysilane, ethyltri-t-butoxysilane;

n-propyltrichlorsilane, n-propyltribromsilane, n-propyltrimethoxysilane, n-propyltriethoxysilane, n-propyltriisopropoxysilane, n-propyltri-t-butoxysilane;

n-hexyltrichlorsilane, n-hexyltribromsilane, n-hexyltrimethoxysilane, n-hexyltriethoxysilane, n-hexyltriisopropoxysilane, n-hexyltri-t-butoxysilane;

n-decyltrichlorsilane, n-decyltribromsilane, n-decyltrimethoxysilane, n-decyltriethoxysilane, n-decyltriisopropoxysilane, n-decyltri-t-butoxysilane;

n-octadecyltrichlorsilane, n-octadecyltribromsilane, n-octadecyltrimethoxysilane, n-octadecyltriethoxysilane, n-octadecyltriisopropoxysilane, n-octadecyltri-t-butoxysilane;

phenyltrichlorsilane, phenyltribromsilane, phenyltrimethoxysilane, phenyltriethoxysilane, phenyltriisopropoxysilane, phenyltri-t-butoxysilane, tetrachlorsilane, tetrabromsilane, tetramethoxysilane, tertaethoxysilane, tetrabutoxysilane, dimethoxydiethoxysilane;

dimethyldichlorsilane, dimethyldibromsilane, dimethyldlmethoxysilane, dimethyldiethoxysilane;

diphenyldichlorsilane, diphenyldibromsilane, diphenyldimethoxysilane, diphenyldiethoxysilane;

phenylmethyldichlorsilane, phenylmethyldibromsilane, phenylmethyldimethoxysilane, phenylmethyldiethoxysilane;

trichlorhydrosilane, tribromhydrosilane, trimethoxyhyrosilane, triethoxyhydrosilane, triisopropoxyhydrosilane, tri-t-butoxyhydrosilane;

vinyltrichlorsilane, vinyltribromsilane, vinyltrimethoxysilane, vinyltriethoxysilane, vinyltriisopropoxysilane, vinyltri-t-butoxysilane;

trifluoropropyltrichlorsilane, trifluoropropyltribromsilane, trifluoropropyltrimethoxysilane, trifluoropropyltriethoxysilane, trifluoropropyltriisopropoxysilane, trifluoropropyltrl-t-butoxysilane;

γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri-t-butoxysilane;

γ-methacryloxypropylmethyldimethoxysilane,
γ-methacryloxypropylmethyldiethoxysilane,
γ-methacryloxypropyltrimethoxysilane,
γ-methacryloxypropyltriethoxysilane,
γ-methacryloxypropyltriisopropoxysilane,
γ-methacryloxypropyltri-t-butoxysilane;

γ-aminopropylmethyldimethoxysilane,
γ-aminopropylmethyldiethoxysilane,
γ-aminopropyltrimethoxysilane,
γ-aminopropyltriethoxysilane,
γ-aminopropyltriisopropoxysilane, γ-aminopropyltri-t-butoxysilane;

γ-mercaptopropylmethyldimethoxysilane,
γ-mercaptopropylmethyldiethoxysilane,
γ-mercaptopropyltrimethoxysilane,
γ-mercaptopropyltriethoxysilane,
γ-mercaptopropyltriisopropoxysilane,
γ-mercaptopropyltri-t-butoxysilane;

β-(3,4-epoxycyclohexyl)ethyltrimethoxysilane, β-(3,4-epoxycyclohexyl)ethyltriethoxysilane;
and partial hydrolysate thereof; and mixture thereof.

In addition, as a binder, particularly, polysiloxane containing fluoroalkyl group can be preferably used. More particularly, mention may be made of hydrolyzed and condensed compound and cohydrolyzed and condensed compound of one or more of the following fluoroalkylsilanes. Generally, the known fluorine-contained silane coupling agents can be used.

$CF_3(CF_2)_3CH_2CH_2Si(OCH_3)_3$;
$CF_3(CF_2)_5CH_2CH_2Si(OCH_3)_3$;
$CF_3(CF_2)_7CH_2CH_2Si(OCH_3)_3$;
$CF_3(CF_2)_9CH_2CH_2Si(OCH_3)_3$;
$(CF_3)_2CF(CF_2)_4CH_2CH_2Si(OCH_3)_3$;
$(CF_3)_2CF(CF_2)_6CH_2CH_2Si(OCH_3)_3$;
$(CF_3)_2CF(CF_2)_8CH_2CH_2Si(OCH_3)_3$;
$CF_3(C_6H_4)C_2H_4Si(OCH_3)_3$;
$CF_3(CF_2)_3(C_6H_4)C_2H_4Si(OCH_3)_3$;
$CF_3(CF_2)_5(C_6H_4)C_2H_4Si(OCH_3)_3$;
$CF_3(CF_2)_7(C_6H_4)C_2H_4Si(OCH_3)_3$;
$CF_3(CF_2)_3CH_2CH_2SiCH_3(OCH_3)_2$;
$CF_3(CF_2)_5CH_2CH_2SiCH_3(OCH_3)_2$;
$CF_3(CF_2)_7CH_2CH_2SiCH_3(OCH_3)_2$;
$CF_3(CF_2)_9CH_2CH_2SiCH_3(OCH_3)2$;
$(CF_3)_2CF(CF_2)_4CH_2CH_2SiCH_3(OCH_3)_2$;
$(CF_3)_2CF(CF_2)_6CH_2CH_2SiCH_3(OCH_3)_2$;
$(CF_3)_2CF(CF_2)_8CH_2CH_2SiCH_3(OCH_3)_2$;
$CF_3(C_6H_4)C_2H_4SiCH_3(OCH_3)_2$;
$CF_3(CF_2)_3(C_6H_4)C_2H_4SiCH_3(OCH_3)_2$;
$CF_3(CF_2)_5(C_6H_4)C_2H_4SiCH_3(OCH_3)_2$;
$CF_3(CF_2)_7(C_6H_4)C_2H_4SiCH_3(OCH_3)_2$;
$CF_3(CF_2)_3CH_2CH_2Si(OCH_2CH_3)_3$;
$CF_3(CF_2)_5CH_2CH_2Si(OCH_2CH_3)_3$;
$CF_3(CF_2)_7CH_2CH_2Si(OCH_2CH_3)_3$;
$CF_3(CF_2)_9CH_2CH_2Si(OCH_2CH_3)_3$;
$CF_3(CF_2)_7SO_2N(C_2H_5)C_2H_4CH_2Si(OCH_3)_3$

By using polysiloxane containing aforementioned fluoroalkyl group is used as a binder, the ink-repellent properties in a photocatalyst-containing layer are remarkably improved and the function of preventing a coating material for a shading part or an ink for an ink jet system from adhering is manifested.

In addition, as a reactive silicone of the aforementioned (2), mention may be made of compounds having a chemical structure represented by the following general formula:

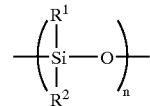

wherein n is an integer of not smaller than 2, $R^1$ and $R^2$ are each substituted or unsubstituted alkyl, alkenyl, aryl or cyanoalkyl group having 1–10 carbon numbers, respectively, and not greater than 40% of the whole in moles is vinyl, phenyl or halogenated phenyl. In addition, the compounds wherein $R^1$ and $R^2$ are methyl group are preferable because the surface energy becomes the smallest. Am amount of not smaller than 60% in terms of a mole rate of methyl group is preferable. In addition, a molecular chain has at least one reactive group such as hydroxy group at an end of a chain and a side chain.

In addition, an stable organosilicon compound which does not perform a cross-linking reaction such as dimethylpolysiloxane may be mixed into a binder together with the aforementioned organopolysilicon.

In the color filter of the invention, various binders such as organopolysiloxane and the like can be used in a photocatalyst-containing layer like this. In the present invention, as described above, fluorine in the surface of a photocatalyst-containing layer may be reduced and, thereby, an inkphilic region may be formed within an ink-repellent region by incorporating fluorine in a photocatalyst-containing layer containing such the binder and the photocatalyst and pattern-irradiating with the energy. Upon this, fluorine needs to be contained in a photocatalyst-containing layer and, as a method of incorporating fluorine into such the photocatalyst-containing layer containing a binder, mention may be made of a method of binding a fluorine compound with a binder which usually have the high binding energy, using the relatively weak binding energy, and a method of mixing into a photocatalyst-containing layer a fluorine compound which is bound by the relatively weak binding energy. By introducing fluorine by such the method, when the energy is irradiated, a fluorine-bound site having the relatively small binding energy is first degraded and, thereby, fluorine can be removed from a photocatalyst-containing layer.

As the aforementioned first method, that is, a method of binding a fluorine compound with a binder which have the high binding energy using the relatively weak binding energy, mention may be made of a method of introducing a fluoroalkyl group as a substituent into the aforementioned organopolysiloxane.

For example, as a method of obtaining organopolysiloxane, organopolysiloxane which exerts the great strength can be obtained by hydrolyzing and polymerization condensing chloro or alkoxysilane and the like by a sol-gel reaction, which is described as (1). Here, in this method, organopolysiloxane is obtained by hydrolyzing and condensing or cohydrolyzing and condensing one or more of silicon compounds represented by the general formula:

(wherein Y represents alkyl group, fluoroalkyl group, vinyl group, amino group, phenyl group or epoxy group, X represents alkoxyl group, acetyl group or halogen, and n is an integer of 0 to 3) as described above. By using a silicon compound having a fluoroalkyl group as a substituent Y in this general formula, organopolysiloxane having a fluoroalkyl group as a substituent can be obtained. When such the organopolysiloxane having a fluoroalkyl group as a substituent group is used as a binder, since a part of a carbon-carbon bond of a fluoroalkyl group is degraded by the action of a photocatalyst in a photocatalyst-containing layer upon the energy irradiation, the fluorine content of a part of the surface of a photocatalyst-containing layer irradiated with the energy can be reduced.

As a silicon compound having a fluoroalkyl group using upon this, a silicon compound having at least one fluoroalkyl group and in which a number of a carbon element in this fluoroalkyl group is 4 to 30, preferably 6 to 20, particularly preferably 6 to 16 is suitably used, being not limiting. Specific examples of such the silicon compound are described as above and, inter alia, the silicon compound having a fluoroalkyl group in which a number of carbon element is 6 to 8 is preferable.

In the present invention, such the silicon compound having a fluoroalkyl group may by used by mix with a silicon compound having no fluoroalkyl group as described above, and a co-hydrolyzed and condensed compound of which may be used as the organopolysiloxane. Alternatively, one or more of such the silicon compounds having the fluoroalkyl group may be used, and a hydrolyzed and condensed compound or a co-hydrolyzed and condensed compound of which may be used as the organopolysiloxane.

In organopolysiloxane having a fluoroalkyl group thus obtained, it is preferable that, among silicon compounds constituting this organopolysiloxane, the silicon compound having a fluoroalkyl group is contained at an amount of not less than 0.01 mol %, preferably not less than 0.1 mol %.

The reasons are as follows. By incorporating such the degree of fluoroalkyl group, the ink-repellent properties on a photocatalyst-containing layer can be enhanced and the difference in the wettability between a part of an ink-repellent region and a part which was converted into an inkphilic region by the energy irradiation can be made to be larger.

In addition, in the method shown by the above (2), organopolysiloxane is obtained by cross-linking a reactive silicone having the excellent water-repellency and oil-repellency. Similarly also in this case, by using a substituent containing fluorine such as fluoroalkyl group and the like as either $R^1$ or $R^2$ in the above general formula or both, fluorine can be contained in a photocatalyst-containing layer. In addition, since a part of a fluoroalkyl group having the smaller binding energy than siloxane bond is degraded when the energy is irradiated, the fluorine content in the surface of a photocatalyst-containing layer can be reduced by the energy irradiation.

On the other hand, as an example of the latter, that is, a method of introducing a fluorine compound which is bound by the weaker energy than the binding energy of a binder, mention may be made of a method of mixing a fluorine-contained surfactant therein when a fluorine compound having a low molecular weight is introduced and, as a method of introducing a fluorine compound having a high molecular weight, mention may be made of a method of mixing a fluorine-contained resin having the high compatibility with a binder resin.

In the present invention, a photocatalyst-containing layer may contain a surfactant besides the aforementioned photocatalyst and binder. More particularly, mention may be made of a hydrocarbon nonionic surfactant such as NIKKOL BL, BC, BO, BB series manufactured by Nikko Chemicals Co., ltd., and a fluorine-contained or silicone-contained nonionic surfactant such as ZONYL FSN, FSO manufactured by Dupont Co., Ltd., Surfron S-141 and 145 manufactured by Asahi Glass Co., Ltd., Megafack F-141 and 144 manufactured by Dainippon Ink & Chemicals Co., Ltd., Ftagent F-200 and F251 manufactured by Neos Co., Ltd., Unidyne DS-401 and 402 manufactured by Daikin Industries, Ltd., Florad FC-170 and 176 manufactured by 3M Co., Ltd. Alternatively, cationic surfactant, anionic surfactant and amphoteric surfactant may be used.

In addition, a photocatalyst-containing layer may contain an oligomer and a polymer such as polyvinylalcohol, unsaturated polyester, acrylic resin, polyethylene, diallyl phthalate, ethylene propylene diene monomer, epoxy resin, phenol resin, polyurethane, melamine resin, polycarbonate, polyvinyl chloride, polyamide, polyimide, styrene butadiene rubber, chloroprene rubber, polypropylene, polybutylene, polystyrene, polyvinyl acetate, polyester, polybutadiene, polybenzimidazole, polyacrylnitrile, epichlorhydrin, polysulfide, polyisoprene, and the like in addition to the aforementioned surfactants.

The content of a photocatalyst in a photocatalyst-containing layer can be set in a range of 5 to 60% by weight, preferably 20 to 40% by weight. In addition, the thickness of a photocatalyst-containing layer is preferably in a range of 0.05 to 10 µm.

The aforementioned photocatalyst-containing layer can be formed by dispersing a photocatalyst and a binder and, if needed, other additives in a solvent to prepare a coating solution, and applying this coating solution. As a solvent used, an alcoholic organic solvent such as ethanol, isopropanol and the like is preferable. Applying can be performed by the known applying method such as spin coating, spray coating, dip coating, roll coating, bead coating or the like. When an ultraviolet-curing type binder is contained as a binder, a photocatalyst-containing layer can be formed by performing the curing treatment by the ultraviolet ray irradiation.

(Picture Element Part)

In the present invention, a picture element part 4 is provided on a wettability-variable layer 3, inter alia, the aforementioned photocatalyst-containing layer as shown in FIG. 1 and FIG. 2. In the present invention, a picture element part is formed in an inkphilic region which is formed by exposing the aforementioned photocatalyst-containing layer, having the low contact angle with a liquid in the predetermined pattern by a plurality of colors of inks with an ink jet system. A picture element part is usually formed of three colors of red (R), green (G) and blue (B). The coloring pattern and an area to be colored in this picture element part can be set arbitrarily. In a color filter of the present invention, a shading part (a black matrix) does not exist between picture element parts. Therefore, two cases can be found, one of which is the case in which a space exist between picture element parts, and another of which is the case in which a picture element part is formed continuously. In the present embodiment, either one may be acceptable. Further, as showing in FIG. 2, it is acceptable that an ink-repellent convex part is provided.

Inks for an ink jet system for forming such the picture element part are roughly divided into an aqueous ink and an oil based ink. Although any ink can be used in the present invention, an aqueous ink based on water is preferable in a respect of the surface tension.

Water alone or a mixed solvent of water and a water-soluble organic solvent can be used as a solvent for an aqueous ink used in the present invention. On the other hand, an ink based on a solvent having a high boiling point is preferably used for an oil based ink in order to prevent the choking of a head. As a coloring agent used for such the ink for an ink jet system, the known pigments and dyes are widely used. In addition, insoluble or soluble resins may be contained in a solvent in Order to improve the dispersibility and the fixing properties. Other components such as surfactant containing nonionic surfactant, cationic surfactant and amphoteric surfactant; preservative; antifungal agent; pH adjusting agent; anti-foaming agent; ultraviolet absorbing agent; viscosity adjusting agent; surface tension adjusting agent and the like may be added thereto as the occasion demands.

In addition, although the conventional ink for an ink jet system can not contain a large amount of a binder resin due to the low suitable viscosity, it is possible to impart the fixing ability to a coloring agent itself by granulating so as to wrap a coloring agent particle with a resin in an ink. Such the ink can be also used in the present invention. Further, so-called hot melt ink and UV-curing ink may be used.

In the present invention, inter alia, an UV-curing ink is preferably used. By using a UV-curing ink, a picture element part is formed by coloring with an ink jet system and, thereafter, UV is irradiated and, thereby, an ink can be cured rapidly which can sent to a next step immediately. Therefore, a color filter can be manufactured effectively.

Such the UV-curing ink has a prepolymer, a monomer, a photopolymerization initiator and a coloring agent as a main component. As a prepolymer, any prepolymer such as polyesteracrylate, polyurethaneacrylate, eposyacrylate, polyetheracrylate, oligoacrylate, alkydacrylate, polyolacrylate, siliconacrylate and the like can be used without limitation.

As a monomer, vinyl monomer such as styrene, vinyl acetate and the like; monofunctional acrylic monomer such as n-hexylacrylate and phenoxyethylacrylate; and multifunctional acrylic monomer such as diethylene glycol diacrylate, 1,6-hexanediol diacrylate, hydroxypiperic ester neopentylglycol diacrylate, trimethylolpropane triacrylate, dipentaerhythritolhexane acrylate and the like can be used. The aforementioned prepolymers and monomers may be used alone or in a mixture of two or more of them.

As a photopolymerization initiator, an initiator which imparts the desired curing properties and the desired recording properties can be selected for use among isobutylbenzoin ether, isopropylbenzoin ether, benzoin ethyl ether, benzoin methyl ether, 1-phenyl-1,2-propadione-2-oxime, 2,2-dimethoxy-2-phenylacetophenone, benzil, hydroxycyclohexyl phenyl ketone, diethoxyacetophenone, 2-hydroxy-2-methyl-1-phenylpropane-1-one, benzophenone, chlorothioxanthone, 2-chlorothioxanthone, isopropylthioxanthone, 2-methylthioxanthone, chlorine-substituted benzophenone, halogen-substituted alkylallylketone and the like. Other components such as photoinitiator assistant such as aliphatic amine, aromatic amine and the like; photosensitizer such as thioxanthosone and the like may be added thereto as the occasional demands.

(Transparent Substrate)

In the first embodiment of the present invention, the wettability-variable layer 3, inter alia, the aforementioned photocatalyst-containing layer is provided on a transparent substrate 2 as shown in FIG. 1 and FIG. 2.

As this transparent substrate, substrates which have hitherto been used for a color filter can be used, without limitation, such as a transparent rigid material having no flexibility such as quartz glass, Pyrex glass, synthetic quartz glass and the like, or a transparent flexible material having the flexibility such as a transparent resin film, a resin plate for optics and the like. Among them, 7059 glass manufactured by Corning Co., Ltd. is a material having the small thermal expansion coefficient and is excellent in the dimensional stability and the workability at heat-treatment at an elevated temperature and, additionally, since it is non-alkali glass containing no alkaline component in a glass, it is suitable for a color filter for a color liquid crystal display apparatus by an active matrix system. In the present invention, a transparent material is usually used for a transparent substrate and a reflective substrate and white-colored substrate may be used. Alternatively, as a transparent substrate, substrates having the surface treated for preventing the alkali dissolution or for imparting the gas barrier properties or for other objects may be used.

(Ink-repellent Convex Part)

In the first embodiment of the present invention, an ink-repellent convex part 5 may be formed between picture element parts 4 as shown in FIG. 2. The composition of such the ink-repellent convex part is not particularly limited as long as it is a resin composition having the ink-repellent properties. In addition, the composition is not necessarily transparent and may be colored. For example, a material which is used for a black matrix (shading part) and which is a material with no black material incorporated therein can be used. More particularly, mention may be made of a composition of a water soluble resin such as polyacrylamide, polyvinyl alcohol, gelatin, casein, cellulose and the like alone or a mixture of two or more of them, and a resin composition such as O/W emulsion, for example, an emulsified reactive silicone. In the present invention, a photocuring resin is suitable used for the reasons of easy handling and curing. In addition, since this ink-repellent convex part is preferable as it grows ink-repellent, the surface thereof may be treated with an ink-repellent treating agent such as a silicone compound and a fluorine-containing compound.

An ink-repellent convex part in the aforementioned first embodiment is preferably relatively higher because it is provided for preventing an ink from mixing upon coloring with an ink jet system but, in view of the flatness of the whole when it is made into a color filter, the thickness near that of a picture element part is preferable. More particularly, it is usually preferably in a range of 0.1 to 2 $\mu$m although it is different depending upon an accumulated amount of an ink blown.

(Protecting Layer)

A protecting layer may be further formed on a surface of a color filter 1 as the occasion demands though not shown in FIG. 1 or FIG. 2. This protecting layer is provided for flattening a color filter and at the same time preventing components contained in a picture element part, or a picture element part and a photocatalyst-containing layer from dissolving into a liquid crystal layer.

The thickness of a protecting layer can be set in view of the light transmittance of a material used, the surface condition of a color filter and the like and, for example, it can be set in a range of 0.1 to 2.0 $\mu$m. A protecting layer can be formed using a resin having the light transmittance required for a transparent protecting layer among the known transparent photosensitive resin, two-pack curing type transparent resin and the like.

2. The Second Embodiment

Figure 3:
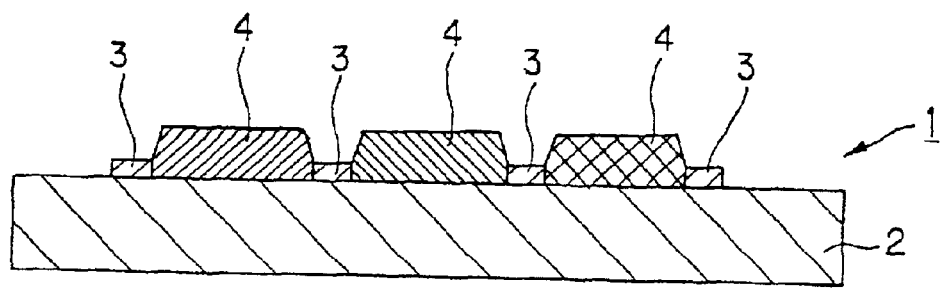
FIG. 3 is a schematic sectional view showing one example of the second embodiment of the color filter according to the present invention.

The second embodiment of the present invention is a color filter in which a picture element part is formed on a transparent substrate, and the wettability-variable layer is formed on a boundary portion of the picture element parts. This shows the other example of a color filter in which a picture element part is positioned through a wettability-variable layer FIG. 3 shows one example of the second embodiment. This color filter 1 is formed of a transparent substrate 2, a picture element part 4 formed on the transparent substrate 2, and a wettability-variable layer 3 formed between the picture element parts 4. A protecting layer not shown in the drawings may be provided on the picture element part 4 and the wettability-variable layer 3 as the occasion demands.

The characteristics of this embodiment are in that a wettability-variable layer 3 is provided on only a boundary portion of a picture element part 4 on a transparent substrate 2 and a picture element part 4 is formed on the transparent substrate 2 directly. Since, in the second embodiment, a wettability-variable layer 3 is formed on only a boundary portion of a picture element part 4 like this, when the wettability is changed by adding the stimulation to a wettability-variable layer 3, the stimulation may be added over the whole side and the stimulation does not necessarily be added in a pattern like state. Therefore, there are effects that steps after formation of a wettability-variable layer may be simplified.

In this embodiment, since a picture element part 4 is provided just on a transparent substrate 2, it is preferable that a surface of a transparent substrate 2 is inkphilic. In particular, when a wettability-variable layer 3 is formed in a pattern like state and, thereafter, a picture element part 4 is formed on a picture element part forming portion therebetween, it is preferable that a surface of a transparent substrate 2 is an inkphilic region compared with a wettability-variable layer 3 which is an ink-repellent region before the change in the wettability in view of formation of a picture element part 4. Therefore, in the second embodiment, it is preferable that the wettability on a transparent substrate 2 is less than 10 degrees as the contact angle with a liquid having the surface tension of 40 mN/m, more preferably not more than 5 degrees, particularly preferably not more than 1 degree.

As a transparent substrate, the surface of which is an inkphilic region, there are a substrate formed of an inkphilic material, a substrate obtained by treating the surface of a material so as to make the surface inkphilic, and an inkphilic layer is formed on a transparent surface, being not limiting in this embodiment.

As an example in which the surface of a material is treated so as to make the surface inkphilic, mention may be made of the inkphilic surface treatment with the plasma treatment utilizing argon and water, and as an inkphilic layer provided on a transparent substrate, mention may be made of a silica membrane obtained by a sol-gel method using tetraethoxysilane.

Since materials and the like used in this embodiment other than a transparent substrate 2, that is, a wettability-variable layer 3, a picture element part 4, a protecting layer and the like are similar to those of the aforementioned first embodiment, they are not explained here.

B. A Process for Producing a Color Filter

Then, a process for producing a color filter of the present invention will be explained using following embodiments.

1. The Third Embodiment

The third embodiment of the present invention is a process for producing a color filter which is the aforementioned first embodiment in the present invention, and said process comprises;

(1) a step of forming a photocatalyst-containing layer having the wettability of a part irradiated with the energy which changed in a direction of reduction of a contact angle with a liquid, on a transparent substrate;

(2) a step of pattern-irradiating with the energy a picture element part forming portion on the photocatalyst-containing layer on which a picture element part is to be formed, to form an exposed part for a picture element part; and (3) a step of coloring the exposed part for a picture element part with an inkjet system to form a picture element part.

(Explanation of Each Step)

FIG. 4 is for explaining each step of the third embodiment of the present invention. In this example, as showing in FIG. 4 (A), first, a photocatalyst-containing layer 6 is formed on a transparent substrate 2. This photocatalyst-containing layer 6 is formed by dispersing the aforementioned photocatalyst and binder in a solvent, if necessary, together with other additives to prepare a coating solution, applying this coating solution, and proceeding the hydrolyzing and polymerization condensing reaction to fix firm a photocatalyst in a binder. As a solvent to be used, alcoholic organic solvents such as ethanol, isopropyl alcohol and the like are preferable, and applying can be performed by the known applying method such as spin coating, spray coating, dip coating, roll coating, bead coating or the like.

Next, an exposed part for a picture element part 8 is formed on a picture element part forming portion on a photocatalyst-containing layer 6 through pattern-irradiated with the energy using a photomask 7. The exposed part for a picture element part 8 is a portion on which the contact angle with a liquid is lowered by the action of a photocatalyst which is included in a photocatalyst-containing layer 6, and converted into an inkphilic region (FIG. 4(B)).

Figure 4A:
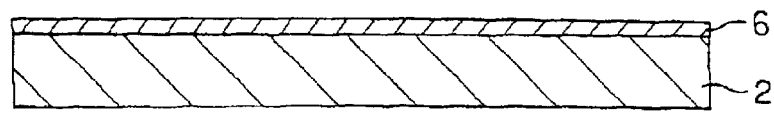
FIG. 4 is a process drawing for explaining the third embodiment of a process for producing the color filter according to the present invention.
Figure 4B:
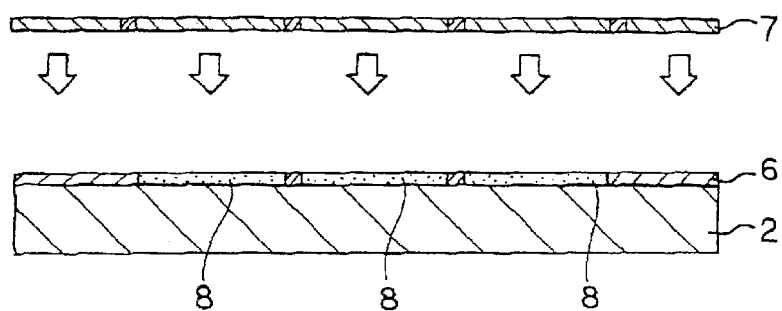
Figure 4C:
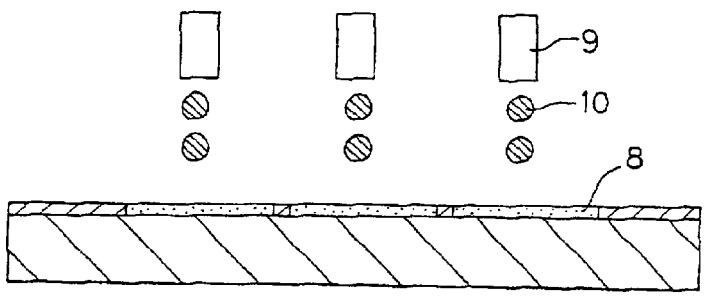

Using an ink jet apparatus 9, an ink 10 is injected into an exposed part for a picture element part 8, which was converted into an inkphilic region by the energy irradiation, to color the part with red, green, and blue (FIG. 4(C)). In this case, since the interior of an exposed part for a picture element part 8 was made into an inkphilic region having the small contact angle with a liquid by the energy irradiation as described above, an ink 10 injected from an ink jet apparatus 9 is spread uniformly in an exposed part for a picture element part 8.

An ink jet apparatus used in the present invention is not particularly limited but an ink jet apparatus can be used which uses various methods such as a method of injecting a charged ink continuously and controlling with the magnetic field, a method of injecting an ink intermittently using a piezo-element, a method of injecting an ink intermittently by heating the ink and utilizing its bubbling.

Figure 4D:
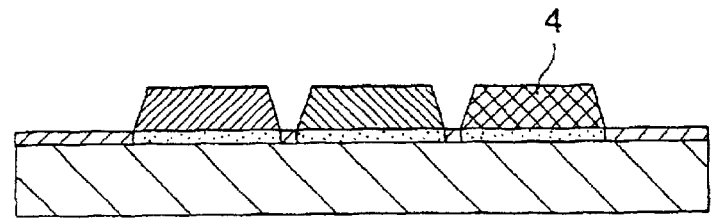

A picture element part 6 is formed by solidifying the ink thus adhered to an exposed part for a picture element part 12 (FIG. 4(D)). In the present invention, the solidification of an ink is carried out by various methods depending upon a kind of an ink used. For example, in the case of a water-soluble ink, the solidification is performed by removing water by heating or the like.

In view of this step of solidifying an ink, as a kind of an ink used in the present invention, an ink is preferably a UV-curing ink. This is because since a UV-curing ink can be rapidly solidified by the UV irradiation, a time for producing a color filer can be shortened.

As described above, since an ink in an exposed part for a picture element part 8 is uniformly spread, when such ink is solidified to form a picture element part 4, a color filter having neither color missing nor color nonuniformity can be formed.

(Another Example of Method for Forming Picture Element Part)

In the embodiment described above, a picture element part 4 can be formed through irradiating with energy at a time and adhering ink to an exposed part. However, in the third embodiment, when adhering ink, there is a narrow space, between exposed parts for an picture element part which is an inkphilic region irradiated with energy. Therefore, there are some possibilities to occur some problems such as mixing two sorts of ink for adjacent picture element parts during formation of the picture element part. As a method for avoiding such a problem, a method shown in FIG. 5 may be proposed, in which a step of irradiating with energy and forming a picture element part are divided into at least two times.

In this method, first, a photocatalyst-containing layer 6 is formed on a transparent substrate 2, similar to that of the third embodiment described above (FIG. 5(A)). Next, the energy is irradiated using a photomask similar to the above-described method. However, in the method described above, the photomask is designed such that exposed parts for a picture element part correspond to the entire picture element part, can be formed. On the other hand, in this method, a photomask 7' is designed such that a picture element part can be formed alternately, then, a exposed part for the first picture element part 11 is formed on the photocatalyst-containing layer 6 using the photomask 7' (FIG. 5(B)). After that, the ink 10 is injected to the exposed part for the first picture element part 11 converted into an inkphilic region by the energy irradiation to color, then cured to form the first picture element part 12 (FIG. 5(C)). The energy irradiation and coloring to a picture element part using inkjet apparatus are conducted similar to that of the first method except a shape of a photomask 7'.

The first picture element part 12 formed by above-described method preferably has ink-repellent property itself in order to prevent the first picture element part from coloring by second ink injection through the inkjet apparatus. Further, the surface of the first picture element part can be treated with ink-repellent treatment agent such as silicone compounds or fluorine including compounds.

Figure 6A:
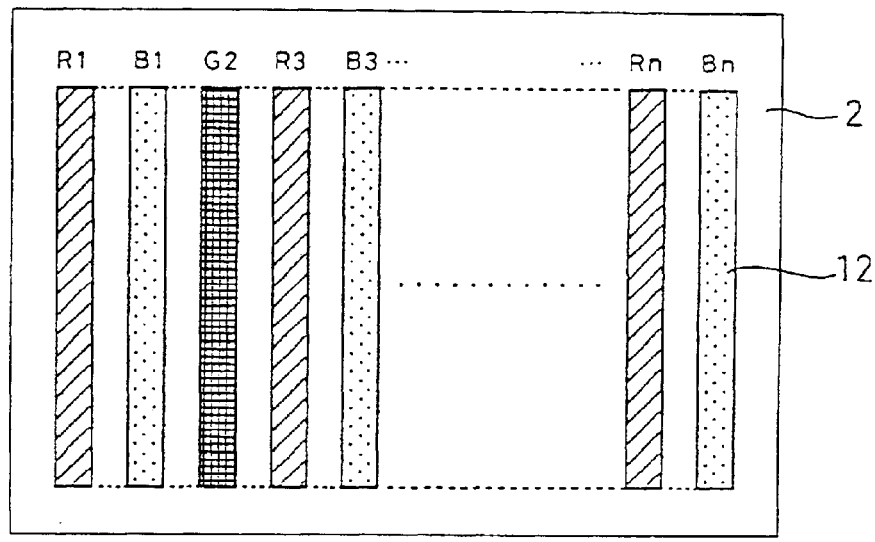
FIG. 6 is a schematic plan view showing the first picture element part and the second picture element part in a process for producing showing in FIG. 5.
Figure 7:
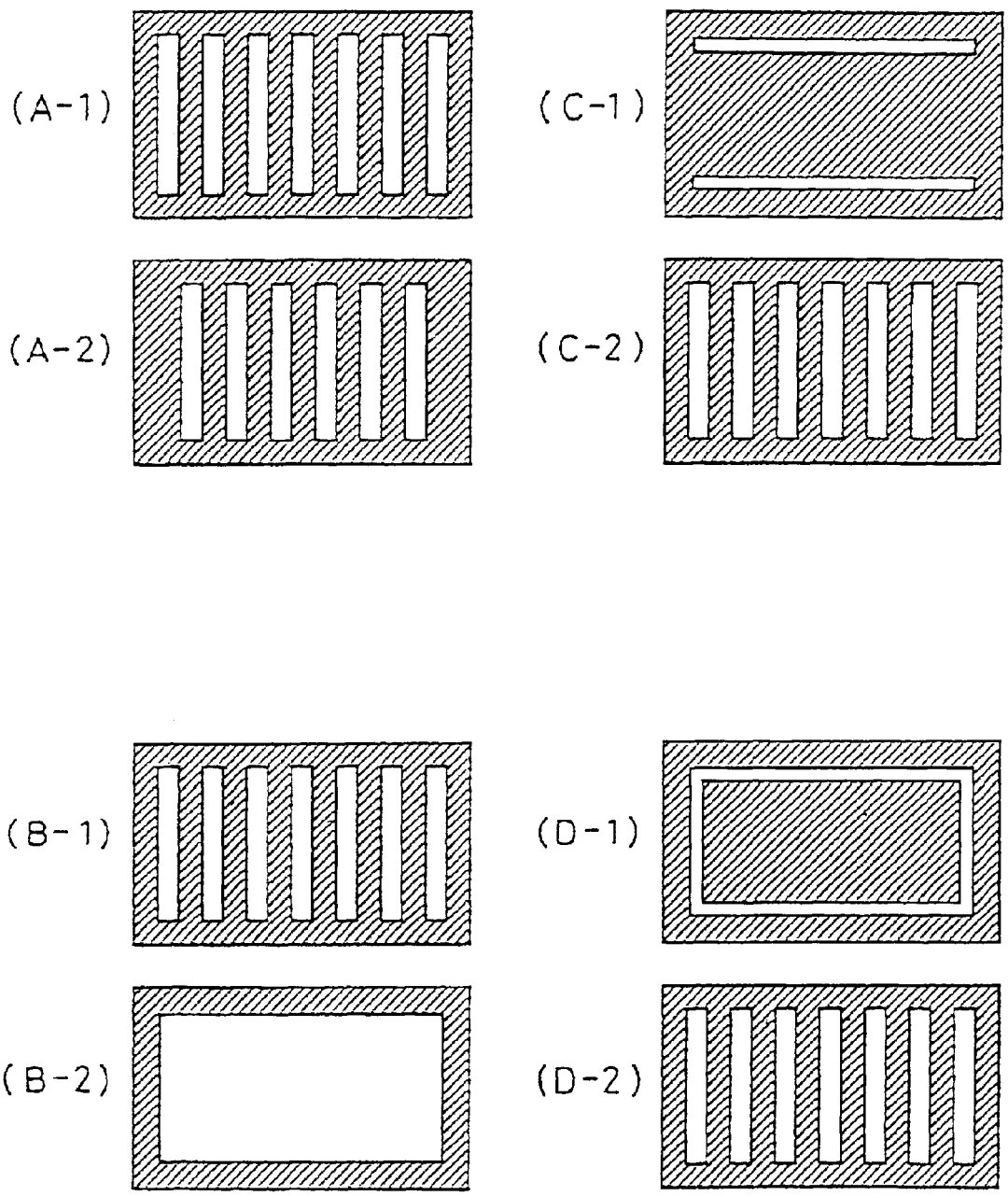
FIG. 7 is a schematic plan view showing the examples of a photomask using in the process for producing the color filter according to the present invention.

The transparent substrate 2 on which the first picture element part 12 is formed, is shown in FIG. 6(A). For example, when picture element parts consist of three color parts of red (R), green (G) and blue (B), from left side, the first red picture element part (R1) is formed, then the first blue picture element part (B1) is formed through skipping the first blue picture element part (G1). Next, the second green picture element part (G2) is formed through skipping the second red picture element part (R2). According to the above described method, for a start, the first picture element part 12 is formed alternately. An example of the photomask 7 using this step, is shown in FIG. 7 as (A-1) or (B-1).

Next, the energy is again irradiated on the entire surface of the photocatalyst-containing layer 6 on which the first picture element part 12 is formed. In this case, the energy may be pattern-irradiated using a photomask again as well as the energy may be irradiated the entire surface like this. The photomask for second pattern-irradiating with the energy is designed such that an exposed part for the second picture element part 13 is formed between the first picture element parts 12, and it is possible to use the photomask, for example, shown in FIG. 7 as (A-2) or (b-2).

Figure 5A:
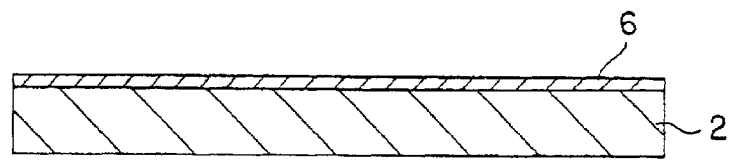
FIG. 5 is a process drawing for explaining an another example of the third embodiment of a process for producing the color filter according to the present invention.
Figure 5B:
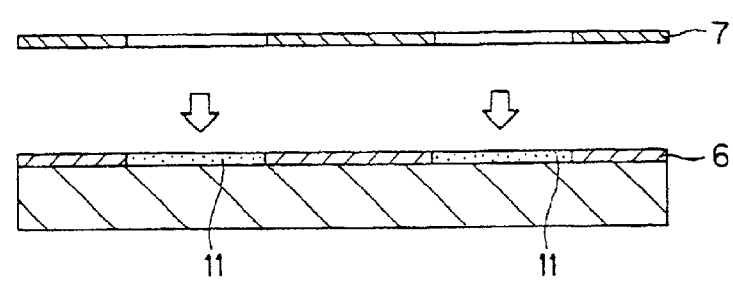
Figure 5C:
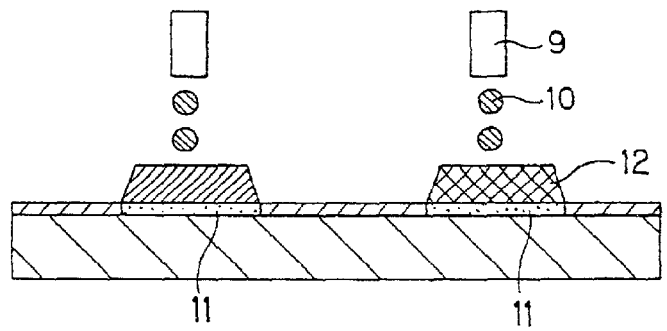
Figure 5D:
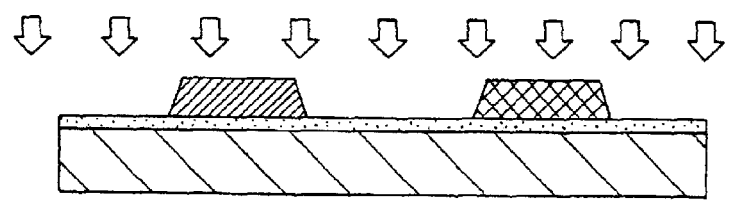
Figure 5E:
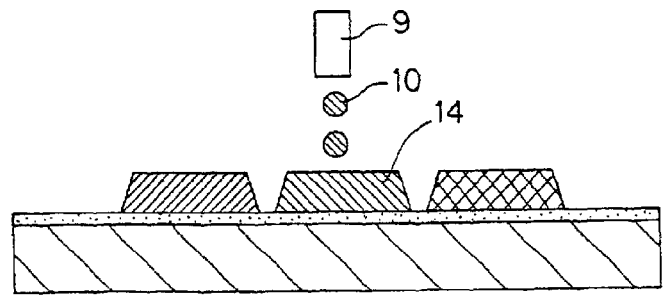

The portion except for an exposed part for the first picture element part 11 is also irradiated with the energy through the energy irradiation to an entire surface, to be converted to an inkphilic region (FIG. 5(D)).

Then, the ink 10 is injected to the inkphilic region through using a inkjet apparatus 9 for coloring the region, and cured the ink to form the second picture element part 14. The second picture element part 14 is illustrated in the figure such that there is a space between the second picture element parts 14 and the first picture element part, however, in practice, the second picture element part 14 is formed so as to fill up a space between the first picture element parts 12. Exposing and coloring to a picture element part using an inkjet apparatus are conducted similar to that of the example described above.

Figure 6B:
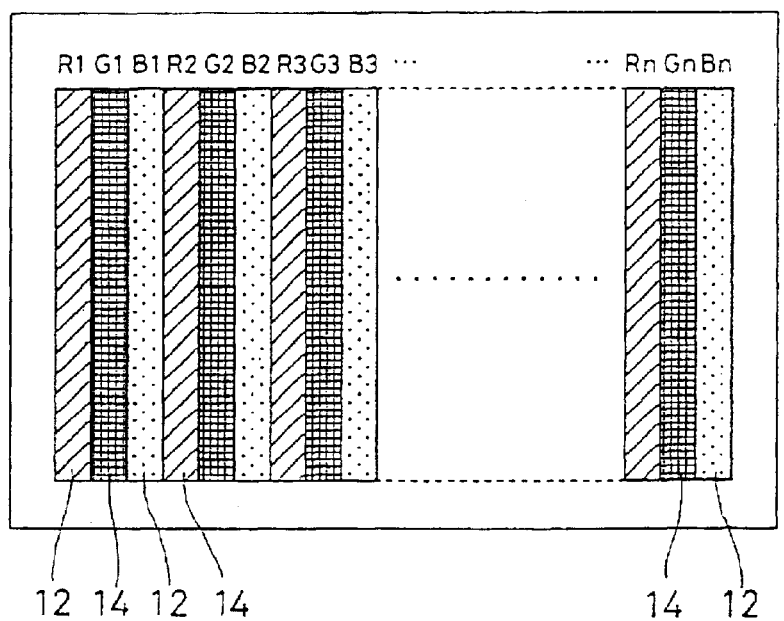

FIG. 6(B) is shown the condition that the second picture element part is formed like this. Through forming the second picture element part 14 so as to fill up a space between the first picture element parts 12, picture element parts having three color parts which sequences in order of red(R), green (G), and blue(B) from left side.

Finally, a protecting layer is formed on the picture element part to form a color filter. Following is the reason why the formation of the picture element part is divided into two times.

In case of forming a picture element part in the condition of not forming a shading part on a transparent substrate, a shading part can not use as a partition. Therefore, when a picture element part is formed such that an exposed part for a picture element part converted to an inkphilic region through the energy irradiation, is colored by an inkjet system, and when a space between the exposed parts for a picture element part is narrow, that is, the width of an ink-repellent region where not irradiating with the energy is narrow, there are some possibilities of mixing some sorts of ink for adjacent picture element parts through migration over an ink-repellent region during formation of a picture element part. Accordingly, it is desirable to form adjacent picture element parts as apart as possible when forming the picture element part. In the method for forming a picture element part described above, when the first picture element part 12 is formed, the energy is pattern-irradiated such that the picture element part is formed alternately. Accordingly, the adjacent picture element part that is formed in the first time can be positioned apart. In this method, an exposed part for the first picture element part 11 can be formed in the condition that a relatively wide ink-repellent region exists between them. Therefore, there is no possibility of mixing some sorts of ink 10 for adjacent picture element parts when coloring through using an inkjet apparatus 9. Then, through irradiating again with the energy between the first picture element parts 12 by the entire irradiation or pattern-irradiation, a space between them are converted to an inkphilic region. And through coloring the space with an inkjet apparatus 9, a color filter which do not have disadvantage such as ink mixing and color nonuniformity, can be obtained.

According to this method, it is possible to reduce or eliminate a space between picture element parts. Therefore, a colored layer (aggregate of picture element parts) having the excellent flatness can be formed. When it is necessary to form a picture element part continuously, this method should be used.

In the method for a picture element part, a photomask using when the second energy irradiation is pattern-irradiation, may be a photomask shown in FIG. 7 as (B-2), in which the entire region on which the first picture element is formed, is exposed to convert the entire ink-repellent region between the first picture element parts 12 to inkphilic region, or may be a photomask shown in FIG. 7 as (A-2), in which the predetermined portion between the first picture element parts is exposed to form the second picture element part.

At the second energy irradiation, through irradiation to the entire surface or irradiation using the photomask showing FIG. 7 as (B-2), there is no space between picture element parts, and a picture element part is formed continuously as shown in FIG. 6(B) concerning thus obtained picture element part. On the other hand, when using a photomask as shown in FIG. 7 as (A-2), a color filter that has a space between the picture element parts, shown in FIG. 5(E), can be obtained, since an ink-repellent region can be remained between the picture element parts. In the present invention, either method can be employed, and a color filter to be obtained may be either type of a color filter.

In addition, in the aforementioned method, a picture element part 6 was formed every other one first time, the present invention is not limited thereto but the change may be performed by the shape of a picture element part of a color filter such as zigzag-like or the like so long as the first formed picture element parts are not in the vicinity. In addition, in the aforementioned explanation, a picture element part was formed by dividing into two times but a picture element part may be formed by dividing into three times or more.

(Concerning Forming Method for Ink-repellent Convex Part)

In the present invention, before forming a picture element part, an ink-repellent convex part may be formed. For example, when the ink-repellent convex part is formed surrounding a picture element part region where the all picture element parts are to be formed, it can be prevented from a problem such that a picture element part can not be formed precisely because ink is flowed out at a portion surrounding a picture element part region.

Such an ink-repellent convex part may be formed following steps; forming an exposed part for an ink-repellent convex part before forming an exposed part for a picture element part, and forming an ink-repellent convex part through applying a resin composition to the exposed part for an ink-repellent convex part. The photomask for forming the ink-repellent convex part described above may be employed one, for example, shown in FIG. 7 as (C-1) or (D-1). First, an exposed part for an ink-repellent convex part is formed through using such a photomask and exposing on a photocatalyst-containing layer. In case of using the photomask shown in FIG. 7 as (C-1), the exposed part for an ink-repellent convex part is formed at the upper end side and at the lower end side of the picture element part region. In case of using the photomask shown as (D-1), the exposed part for an ink-repellent convex part is formed surrounding the picture element part region. Then, a resin composition is adhered to the exposed part for an ink-repellent convex part and cured to form an ink-repellent convex part.

After forming such an ink-repellent convex part, through using the method for forming a picture element part described above (for example, the first picture element part is formed through using the photomask shown in FIG. 7 as (C-2) or (D-2), and then the second picture element part is formed through using the photomask shown as (A-2) or (B-2), or irradiating the entire surface), a picture element part is formed, and a color filter is formed.

In the present invention, a region where the ink-repellent convex part may be formed between picture element parts as well as formed at upper and lower end part of a picture element part region or surrounding a picture element part region.

A step of forming this ink-repellent convex part will be explained using FIG. 8. According to the same manner as in the aforementioned third embodiment shown in FIG. 4, a photocatalyst-containing layer 6 is formed so as to cover a transparent substrate 2 (FIG. 8(A)), and thus obtained member is irradiated with the energy via a photomask for an ink-repellent convex part 15. By pattern-irradiating the energy via a photomask for an ink-repellent convex part, an exposed part for an ink-repellent convex part 16 is formed on a photocatalyst-containing layer 6 on a boundary portion of a picture element part (FIG. 8(B)).

Figure 8A:
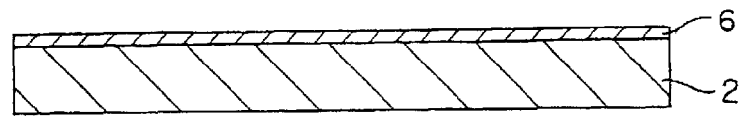
FIG. 8 is a process drawing for explaining an another example of the third embodiment of a process for producing the color filter according to the present invention.
Figure 8B:
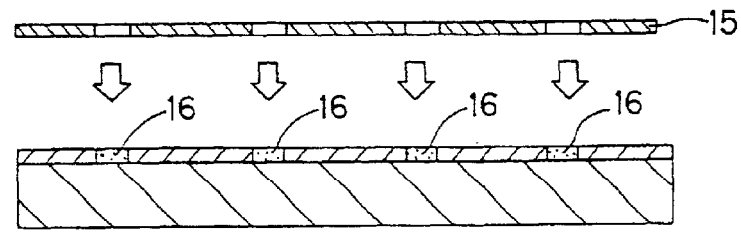
Figure 8C:
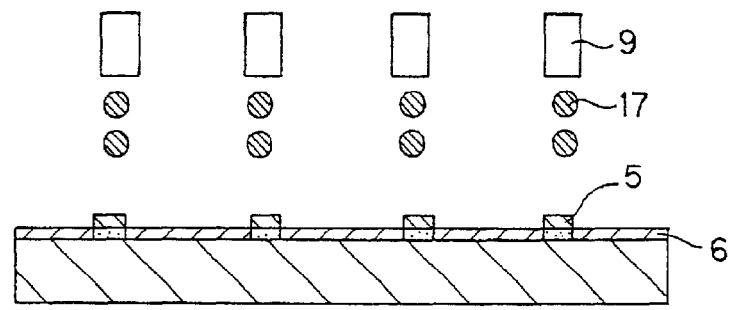

Ink for an ink-repellent convex part 17 such as a UV-curing resin monomer is adhered to this exposed part for an ink-repellent convex part 16 by an Ink jet apparatus 9 (FIG. 8(C)). A method of applying the ink for an ink-repellent convex part is not limited to a method by an ink jet apparatus but other methods, for example, dip coating and the like may be used.

And, by curing an ink for an ink-repellent convex part 17 by UV irradiation or the like an ink-repellent convex part 5 is formed on the surface of a photocatalyst-containing layer 6 (FIG. 8(C)).

Figure 8D:
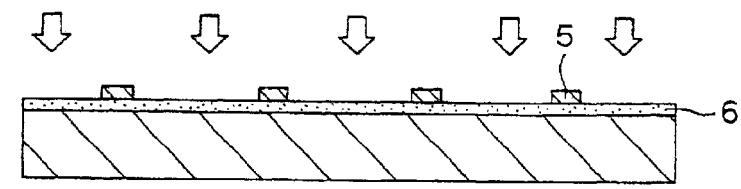
Figure 8E:
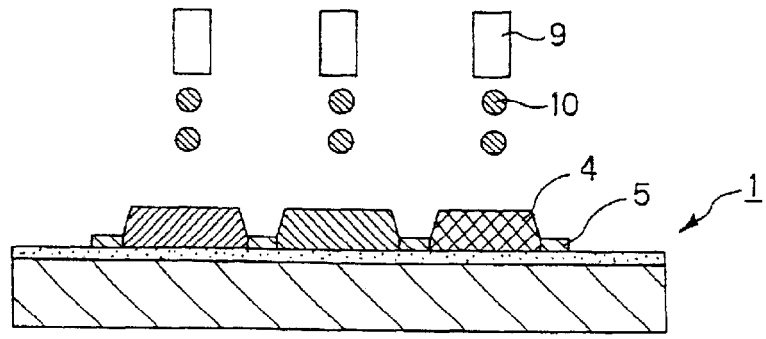

By irradiating the whole surface or pattern-irradiating with the energy from a side of a photocatalyst-containing layer 6, to the thus formed member in which an ink-repellent convex part 5 is formed on a photocatalyst-containing layer 6, a part other than a part on which an ink-repellent convex part 5 is formed, or only a picture element part forming portion, is exposed and made into an exposed part for a picture element part (FIG. 8(D)) and, thereafter, according to the aforementioned manner, an ink 10 is injected and adhered to this part using an ink jet apparatus 9 and cured to form a picture element part 4 and, thus, a color filter 1 with an ink-repellent convex part 5 provided thereon can be manufactured (FIG. 8(E)).

In this method, since an exposed part for an ink-repellent convex part is provided by pattern-irradiating a photocatalyst-containing layer between picture element parts with the energy, an ink-repellent convex part having an arbitrary width can be formed. Therefore, by applying an ink for an ink-repellent convex part thereon, an ink-repellent convex part having an arbitrary width can be formed. Hence, by adjusting the width of a photomask for an ink-repellent convex part 15, adjusting the width between picture element parts can be conducted.

In addition, in this embodiment, an ink-repellent convex part is formed by utilizing the change in the wettability of a photocatalyst-containing layer but the formation is not limited to this in the present invention and, for example, an ink-repellent convex part may be provided by a photolithography or the like.

(Energy to be Irradiated)

In the present invention, the light including the ultraviolet light may be used as the energy to be irradiated to a photocatalyst-containing layer. As a light source including the ultraviolet light, for example, mention may be made of a mercury lamp, a metal halide lamp, a xenon lamp and the like. The wavelength of the light used for this exposure can be set from a range of not greater than 400 nm, preferably not greater than 380 nm. In addition, an amount of the light to be irradiated upon exposure may be an amount of irradiation necessary for an exposed part to express the inkphilic properties by the action of a photocatalyst.

When pattern-irradiation is necessary upon the energy irradiation, pattern-irradiation can be performed via a photomask using the aforementioned light source. Alternatively, as an another method, there can also be used a method of picture-irradiating in a pattern like state using a laser such as excimer, YAG and the like. However, such the method may lead to a problem that an apparatus is expensive, the handling is difficult and further the continuous output can not be performed.

Therefore, in the present invention, the pattern of an inkphilic region may be formed by adding the photocatalystic reaction initiating energy to a photocatalyst-containing layer, and adding the reaction rate increasing energy to a region which received the photocatalystic reaction initiating energy in a pattern like state. The reasons are as follows. By forming the pattern using such the energy irradiating method, the reaction rate increasing energy such as the infrared laser which is relatively low cost and easily handled, can be used and the aforementioned problem does not occur.

The pattern of an inkphilic region having the changed wettability can be formed by the addition of such the energy based on the following reasons. That is, first, by adding the photocatalystic reaction initiating energy to a region on which the pattern is to be formed, the photocatalystic reaction is initiated on a photocatalyst-containing layer. Then, the reaction rate increasing energy is added in a region which receives the photocatalystic reaction initiating energy. By adding the reaction rate increasing energy like this, a reaction in a photocatalyst-containing layer to which the photocatalystic reaction initiating energy has been already added and In which a reaction has been initiated by the catalytic action of a photocatalyst is rapidly accelerated. Then, by adding the reaction rate increasing energy for the predetermined period, the change of the wettability in the photocatalyst-containing layer is changed into the desired range and, thus, the pattern to which the reaction rate increasing energy has been added can be made into the pattern of an inkphilic region having the changed wettability.

a. Photocatalystic Reaction Initiating Energy

The photocatalystic reaction initiating energy used for this energy irradiating method refers to the energy that a photocatalyst initiates a catalytic reaction for changing the properties of a compound in a photocatalyst-containing layer.

An amount of the photocatalystic reaction irradiating energy to be added is such the degree of an amount that does not cause the rapid change in the wettability in a photocatalyst-containing layer. When an amount of the photocatalystic reaction initiating energy to be added is small, since the sensitivity upon formation of the pattern by adding the reaction rate increasing energy is lowered, being not preferable. On the other hand, when this amount is too large, the degree of the change in the properties in a photocatalyst-containing layer to which the photocatalystic reaction initiating energy has been added becomes too large and the difference between regions to which the reaction rate increasing energy has been added and not added becomes unclear, being not preferable. An amount of the energy to be added is determined by performing a preliminary experiment on an amount of the energy to be added and the change in the wettability in a photocatalyst-containing layer.

The photocatalystic reaction initiating energy in this method is not particularly limited as long as the energy which can initiate the photocatalystic reaction and, inter alia, the light is preferable.

A photocatalyst used in the present invention has the different wavelength of the light, which initiates a catalytic reaction depending upon the band gap thereof. For example, in the case of cadmiun sulfide, the wavelength is 496 nm and, in the case of iron oxide, the wavelength is 593 nm of the visible light and, in the case of titanium oxide, the wavelength is 388 nm of the ultraviolet light. Therefore, the light can be used in the present invention whether the visible light or the ultraviolet light as long as the light. However, in the context that titanium dioxide is suitably used as a photocatalyst because it is effective as a photocatalyst due to the high band gap energy as described above, chemically stable, has no toxicity and easily available, the light is preferably the light containing the ultraviolet light which initiates a catalytic reaction of this titanium oxide. More particularly, it is preferable that the ultraviolet light in a range of not greater than 400 nm, preferably not greater than 380 nm is contained.

As the light source for such the light containing the ultraviolet light, mention may be made of various ultraviolet sources such as a mercury lamp, a metal halide lamp, a xenon lamp, an excimer lamp and the like.

In the present invention, a range to which this photocatalystic reaction initiating energy is to be added may be a part of a photocatalyst-containing layer. For example, by adding this photocatalystic reaction initiating energy in a pattern like state and further adding the reaction rate increasing energy also in a pattern like state, it is possible to form the pattern of an inkphilic region having the changed wettability. However, for the reasons of similification of steps and the like, it is preferable that this photocatalystic reaction initiating energy is added to the whole surface of a region on which the pattern is to be formed. It is preferable that, by adding the reaction rate increasing energy to a region to the whole surface of which the photocatalystic reaction initiating energy has been added in a pattern like state, the pattern of an inkphilic region is formed on a photocatalystic-containing layer.

b. Reaction Rate Increasing Energy

Then, the reaction rate increasing energy used in this method will be explained. The reaction rate increasing energy used in this method refers to the energy for increasing a reaction rate of a reaction changing the wettability of a photocatalyst-containing layer which was initiated by the aforementioned photocatalystic reaction initiating energy. In the present invention, any energy can be used as long as it is the energy having such the action and, inter alia, the heat energy is preferably used.

A method of adding such the heat energy to a photocatalyst-containing layer in a pattern like state is not particularly limited as long as it can form the pattern by the heat on a photocatalyst-containing layer but mention may be made of a method by the infrared laser, a method by a heat-sensitive head and the like. As such the infrared laser, mention may be made of the infrared YAG laser (1064 nm) having the advantages such as the strong directivity and the long irradiation distance, a diode laser (LED; 830 nm, 1064 nm, 1100 nm) having the advantages such as the relatively low cost, a semiconductor laser, a He—Ne laser, a carbonic dioxide gas laser and the like.

In this method, the pattern of an inkphilic region can be formed based on the difference in the reaction rate between regions to which the reaction rate increasing energy has been added and a region to which the reaction rate increasing energy has not been added, by adding the aforementioned photocatalystic reaction initiating energy and activating a photocatalyst to initiate the change in the wettability by the catalytic reaction in a photocatalyst-containing layer, and adding the reaction rate increasing energy to a part having the changed wettability to promote the catalytic reaction of the part.

2. The Forth Embodiment

The forth embodiment of the present invention is one of processes for producing a color filter of the aforementioned second embodiment of the present invention, and comprises:

(1) a step of forming a photocatalyst-containing layer having the wettability of the energy-irradiated part on a transparent substrate, which changes in a direction of reduction of the contact angle with liquid, on a boundary portion of a picture element part forming portion which is a part on which a picture element part is to be formed; and (2) a step of forming the picture element part on the picture element part forming portion on the transparent substrate.

This process is explained using FIG. 9. A photocatalyst-containing layer 6 is first formed on a boundary portion of a picture element part forming portion, on which a picture element part is to be formed, on a transparent substrate 2. As a method of forming a photocatalyst-containing layer in a pattern like state, for example, mention may be made of a method forming the layer by a photolithography using a photosensitive sol-gel solution, a method by printing and the like.

Figure 9A:
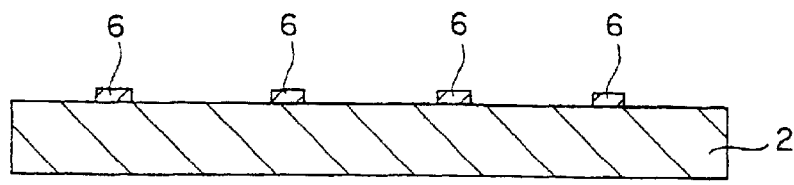
FIG. 9 is a process drawing for explaining the forth embodiment of a process for producing the color filter according to the present invention.
Figure 9B:
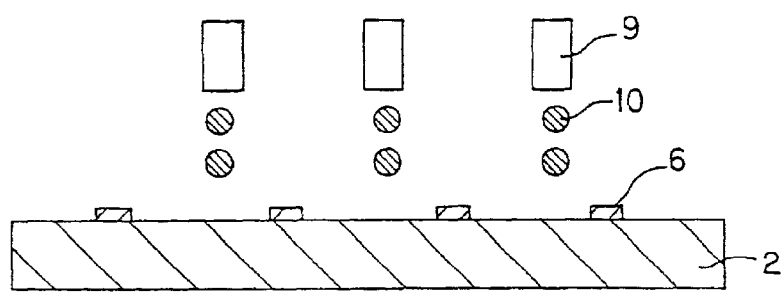
Figure 9C:
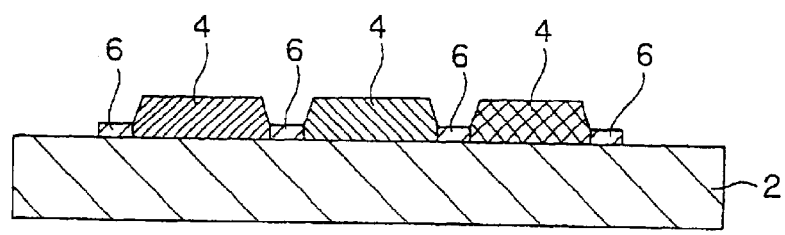

Ink 10 is adhered using an ink jet apparatus 9 on a part (picture element part forming portion) on which a photocatalyst-containing layer 6 is not formed, on a transparent substrate 2 on which the thus formed photocatalyst-containing layer 6 is formed (FIG. 9(B)). Upon this, the wettability of the surface of a transparent substrate 2 has been made into more inkphilic as compared with the wettability of a surface on a photocatalyst-containing layer 6. Therefore, upon formation of a picture element part 4, ink 10 is not adhered to a photocatalyst-containing layer showing the ink-repellent properties and is adhered to only a picture element part forming portion on a transparent substrate 2, to form a picture element part. Then, adhered ink is cured to form a picture element part 4 between a photocatalyst-containing layer 6 (FIG. 9(C)).

Figure 9D:
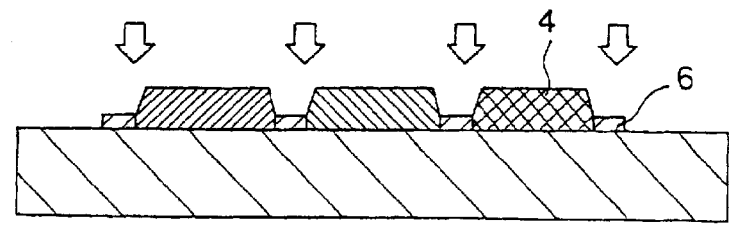

After forming a picture element part 4, the energy is irradiated from a side on which a picture element part 4 is formed (FIG. 9(D)). In this case, a protecting layer (not shown in a drawing) which is formed as needed, can be formed easily because a photocatalyst-containing layer 6 is converted into an inkphilic region.

In this embodiment, because ink 10 is adhered directly on the transparent substrate 2, it is preferable that the wettability on a transparent substrate 2 is inkphilic. More particularly, it is preferable that the wettability is less than 10 degrees as the contact angle with a liquid having the surface tension of 40 mN/m, more preferably not more than 5 degrees as the contact angle with a liquid having the surface tension of 40 mN/m, particularly preferably not more than 1 degree. This is because, by making a surface of a transparent substrate 2 into an inkphilic region, an ink 10 is uniformly spread over a transparent substrate and disadvantages such as color nonuniformity and the like do not occur.

Also in this embodiment, since the energy to be irradiated, ink jet apparatus and various inks are similar to those of the aforementioned embodiments, the explanation thereof is omitted.

C. Color Liquid Crystal Panel

A color liquid crystal panel can be formed by combining the thus obtained color filter, and an opposite substrate which is opposite to this color filter and having a black matrix, and encapsulating a liquid crystal compound therebetween. The thus obtained color liquid crystal panel has the advantages originated from the color filter of the present invention, that is, advantages that color nonuniformity and color missing do not occur, and it is advantageous in a respect of cost.

The present invention is not limited to the aforementioned embodiments. The aforementioned embodiments are merely illustrative and whatsoever has the substantially same construction as that described in claims and exerts the same action and effects are included in the present invention.

EXAMPLES

The present invention is explained in detail by means of the following examples.

Example 1

1. Formation of Photocatalyst-containing Layer 30 g of isopropylalcohol, 0.4 g of MF-160E (manufactured by Tohchem Products Co.), a main component of which is fluoroalkylsilane, 3 g of trimethoxymethylsilane (manufactured by Toshiba Silicone Co., Ltd., TSL8113) and 20 g of a dispersion of titanium oxide which is photocatalyst in water ST-KO1 (manufactured by Ishthara Sangyo Kaisha, Ltd.) were mixed and stirred at 100° C. for 20 minutes. This was diluted three-times with isopropylalcohol to obtain a composition for a photocatalyst-containing layer.

The composition was applied on a glass transparent substrate with a spin coater and dried at 50° C. for 10 minutes to form a transparent photocatalyst-containing layer (thickness 0.2 μm).

2. Confirmation of Formation of an Inkphilic Region by Exposure

The pattern-exposure was performed for 50 seconds on this photocatalyst-containing layer at an illuminance of 70 mW/cm$^2$ with a mercury lamp (wavelength 365 nm) via a photomask, an exposed part was formed and the contact angles with a liquid of an unexposed part and an exposed part were measured. At unexposed part, the contact angle with a liquid having the surface tension of 30 mN/m (manufactured by Junsei Chemical Co., Ltd., ethylene glycol monoethyl ether) was measured (after 30 seconds from dropping of a droplet from a microsyringe) of using a contact angle measuring apparatus (manufactured by Kyowa Interface Science Co., Ltd., type CA-Z) and found to be 30 degrees. As an exposed part, the contact angle with a liquid having the surface tension of 50 mN/m (manufactured by Junsei Chemical Co., Ltd., wettability index standard solution No. 50) was measured in a similar method and found to be 7 degrees. Like this, an exposed part was converted into an inkphilic region and it was confirmed that the pattern formation is possible due to the difference in the wettability between an exposed part and an unexposed part.

3. Formation of First Picture Element Part

Then, a photocatalyst-containing layer was formed on a transparent substrate according to the same manner as that described above (correspond to FIG. 5(A)). This photocatalyst-containing layer was exposed (at an illuminance of 70 mW/cm$^2$ for 50 seconds) with a mercury lamp (wavelength 365 nm) via a photomask which has an opening pattern shown in FIG. 7 as (B-1), convert an exposed part for the first picture element part into an inkphilic region (not greater than 7 degrees in terms of the contact angle with a liquid having the surface tension of 50 mN/m) (correspond to FIG. 5(B)).

Then, a UV-curing type multifunctional acrylate monomer ink of each RGB color containing 5% by weight of a pigment, 20% by weight of a solvent, 5% by weight of an initiator and 70% by weight of a UV-curing resin was used for the first picture element part to color it with a corresponding color using an ink jet apparatus, and UV-treated to cure it, and the first picture element part is formed (correspond to FIG. 5(C) and FIG. 6(A)). Here, as regards each of red, green and blue ink, as a solvent, polyethylene glycol monometylethyl acetate was used and, as an initiator, Ilgacular 369 (trade name, manufactured by Chiba Speciality Chemicals Co., Ltd.) was used and, as a UV-curing resin, DPHA (dipentaerythritol hexaacrylate, manufactured by Nippon Kayaku Co., Ltd.) was used. In addition, regarding a pigment, as a red ink, C. I. Pigment Red 177 was used and, as a green ink, C. I. Pigment Green 36 was used and, as a blue ink, C. I. Pigment Blue 15+C. I. Pigment Violet 23 was used.

4. Formation of Second Picture Element Part

Next, the photocatalyst-containing layer was exposed (at an illuminance of 70 mW/cm$^2$ for 50 seconds) with a mercury lamp (wavelength 365 nm) via a photomask which has an opening pattern shown in FIG. 7 as (B-2), convert an exposed part for the second picture element part into an inkphilic region (not greater than 7 degrees in terms of the contact angle with a liquid having the surface tension of 50 mN/m) (correspond to FIG. 5(D)). And then, the second picture element part was formed between the first picture element parts similar to the method for forming the first picture element part (FIG. 5(E) and FIG. 6(B)).

5. Formation of a Protecting Layer

A protecting layer was formed by applying a two-pack mixing type thermally curing agent (SS7265 manufactured by Nippon Synthetic Rubber Co., Ltd.) with a spin coater and curing-treated at 200° C. for 30 minutes to obtain a color filter. Although the resulting color filter was not provided a black matrix, it was of the high quality free from color missing or color nonuniformity at a picture element part.

Example 2

According to the similar manner to that in Example 1, the similar photocatalyst-containing layer was formed on a transparent substrate. Then, an ink-repellent convex part on the photocatalyst-containing layer was formed as follow.

First, 10 g of a UV-curing type resin (ester acrylate resin, manufactured by Arakawa Chemical Co., Ltd., trade name; AQ-11), 0.5 g of an initiator (manufactured by Chiba Speciality Chemicals Co., Ltd. trade name; Ilgacular 184), and 1.25 g of distilled water were agitated for 3 minutes, then a composition for an ink-repellent convex part was obtained.

Next, thus formed photocatalyst-containing layer was exposed via a photomask which has an opening pattern shown in FIG. 7 as (C-1) similar manner to that in Example 1, and wettability was changed to obtain an exposed part for an ink-repellent convex part. Then, the composition for an ink-repellent convex part was applied on the exposed part for an ink-repellent convex part with a dip coater at the rate of 5 cm/sec., after that, exposed by UV to form the ink-repellent convex part having thickness of 1.7 μm.

On the photocatalyst-containing layer on which the ink-repellent convex part was formed, the first picture element part was formed by the similar manner to that in Example 1 except for using a photomask on which an opening pattern shown in FIG. 7 as (C-2) was provided.

Then, the second picture element part was formed by the similar manner to that in Example 1 except for using a photomask which has an opening pattern shown in FIG. 7 as (A-2), for exposing a space between the first picture element parts, and a protecting layer was formed by the similar manner to that in Example 1.

Because of having the ink-repellent convex part, thus obtained color filter did not have a problem such that a picture element part can not form precisely since ink flowed out at a portion surrounding a color filter, and it was of the high quality free from color missing or color nonuniformity at a picture element part similar to that of Example 1.

Example 3

1. Formation of a Photocatalyst-containing Layer 3 g of isopropylalcohol, 0.014 g of fluoroalkylsilane (manufactured by Tohchem Products Co.; MF-160E (trade name), a 50% by weight solution of isopropyl ether of N-[3-(trimethoxysilyl)propyl]-N-ethylperfluorooctabesulfonamide), 2 g of a titanium oxide sol (manufactured by Ishihara Sangyo Kaisha, Ltd.: STS-01 (trade name)), 0.6 g of a silica sol (manufactured by Nippon synthetic Rubber, Ltd.; Glaska HPC7002 (trade name)) and 0.2 g of alkylalkoxysilane (manufactured by Nippon synthetic Rubber, Ltd.; HPC402II (trade name)) were mixed and stirred at 100° C. for 20 minutes. This solution was applied on a non-alkali glass substrate having the thickness of 0.7 mm by a spin coating method to obtain a photocatalyst-containing layer having the thickness of 0.15 μm.

2. Confirmation of Formation of an Inkphilic Region by Exposure and Reduction of an Amount of Fluorine The surface of this photocatalyst-containing layer was irradiated with the ultraviolet light for 2 minutes at an illuminance of 70 mW/cm$^2$ (365 nm) by a super high pressure mercury lamp via a lattice-like photomask, and a contact angle with n-octane (surface tension of 21 mN/m) was measured with a contact angle measuring apparatus (manufactured by Kyowa Interface Science Co., Ltd., type CA-Z) and found to be 52 degrees at an unexposed part and 0 degrees at an exposed part.

An unexposed part and an exposed part were elementally-analyzed with a X-ray photoelectron spectroscopy apparatus (V.G. Scientific Co., Ltd., ESCLAB220-I-XL). The quantitive calculation was performed with the Sherry correction and Scofield relative sensitivity correction to obtain the results which were expressed as a relative value of weight relative to 100 of titanium (Ti) and found to be fluorine (F) 1279 relative to titanium (Ti) 100 at an unexposed part and flourine (F) 6 relative to titanium (Ti) 100 at an exposed part.

From these results, it was found that, by exposing a photocatalyst-containing layer, a ratio of fluorine in the surface of the photocatalyst-containing layer is reduced and, thereby, the surface is converted from ink-repellent into inkphilic.

What is claimed is:

1. A color filter, in which a shading part provided on a border part of a picture element part is not formed, comprising a transparent substrate, a photocatalyst-containing layer formed on the transparent substrate comprising at least a photocatalyst and a binder, and having a wettability which is changed so that a contact angle with a liquid is reduced by an energy irradiation, and the picture element part being provided on the photocatalyst-containing layer by a pattern of a plurality of colors with an ink jet system; and wherein an ink-repellent convex part is formed on the photocatalyst-containing layer at the border part of the picture element part.

2. The color filter according to claim 1, wherein the photocatalyst is one or more substances selected from the group consisting of titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$) and iron oxide ($Fe_2O_3$).

3. The color filter according to claim 2, wherein the photocatalyst is titanium oxide ($TiO_2$).

4. The color filter according to claim 3, wherein the photocatalyst-containing layer contains a fluorine element in a surface of the photocatalyst-containing layer at rate of 5 times more relative to the Ti element as determined by a X-ray photoelectron spectroscopy.

5. The color filter according to claim 1, wherein the binder is organopolysiloxane having a fluoroalkyl group.

6. The color filter according to claim 1, wherein the binder is organopolysiloxane which is a hydrolyzed and condensed compound or co-hydrolyzed and condensed compound of one or more of silicon compound; represented by YnSiX (4−n) wherein Y represents alkyl group, fluoroalkyl group, vinyl group, amino group, phenyl group or epoxy group, X represents alkoxyl group or halogen, and n is an integer of 0 to 3.

7. The color filter according to claim 6, wherein a silicon compound having a fluoroalkyl group among the silicon compounds constituting the organopolysiloxane is contained at an amount of 0.01 mol % or more.

8. The color filter according to claim 1, wherein a contact angle with a liquid having the surface tension of 40 mN/m on the photocatalyst-containing layer is not less than 10 degrees at a part not irradiated with the energy and less than 10 degrees at a part irradiated with the energy.

9. The color filter according to claim 1, wherein the picture element part colored with an ink jet system is a picture element part colored with an ink jet system using a UV-curing ink.

10. The color filter according to claim 1,
wherein the photocatalyst-containing layer contains fluorine and the photocatalyst-containing layer is formed so that the fluorine content in a surface of the photocatalyst-containing layer is reduced by an action of the photocatalyst upon irradiating the photocatalyst-containing layer with the energy as compared with before the energy irradiation.

11. The color filter according to claim 10, wherein the fluorine content in part in which the fluorine content is reduced by irradiating the photocatalyst-containing layer which the energy is 10 or less relative to 100 of the fluorine content of a part not irradiated with the energy.

12. A liquid crystal panel comprising a color filter according to claim 1 and a substrate which are opposite to the color filter, and provided a shading part, wherein a liquid crystal compound is encapsulated between both substrates.

13. A color filter, in which a shading part provided or a border part of a picture element part is not formed, comprising a transparent substrate, a picture element part provided on the transparent substrate by a pattern of a plurality of colors with an ink jet system, and a photocatalyst-containing layer formed on the border part of the picture element part comprising at least a photocatalyst and a binder, and having a wettability which is changed so that a contact angle with a liquid is reduced by an energy irradiation.

14. The color filter according to claim 13, wherein the wettability on the transparent substrate is less than 10 degrees in terms of the contact angle with a liquid having the surface tension of 40 mN/m.

15. A process for producing a color filter, in which a shading part provided on a border part of a picture element part is not formed, which comprises:
(1) a step of providing a photocatalyst-containing layer having the wettability of the energy-irradiated part which changes in a direction of reduction of the contact angle with a liquid, on a transparent substrate;
(2) a step of forming an exposed part for an ink-repellent convex part by pattern-irradiating with energy an an ink-repellent convex part forming portion on which the ink-repellent convex part, on the photocatalyst-containing layer formed on the transparent substrate, is to be formed;
(3) a step of forming the ink-repellent convex part by applying an ink to the exposed part for an ink-repellent convex part;
(4) a step of forming an exposed part for a picture element part by irradiating with energy on a picture element part forming portion on which the picture element part, on the photocatalyst-containing layer formed on the transparent substrate, is to be formed; and
(5) a step of coloring the exposed part for the picture element part with an ink jet system, to form the picture element part.

16. The process for producing a color filter according to claim 15, wherein the ink-repellent convex part is formed between the picture element parts.

17. The process for producing a color filter according to claim 15, wherein the contact angle on the photocatalyst-containing layer with a liquid having a surface tension of 40 mN/m is 10 degrees or more at a part not irradiated with the energy and less than 10 degrees at a part irradiated with the energy.

18. The process for producing a color filter according to claim 15, wherein the step of coloring the exposed part for the picture element part with the ink jet system uses a UV-curing ink.

19. A process for producing a color filter, in which a shading part provided on a border part of a picture element part is not formed, which comprises:
(1) a step of providing a photocatalyst-containing layer having a wettability of an energy-irradiated part which changes in a direction of reduction of a contact angle with a liquid, at the border part of a picture element part forming portion on which the picture element part is to be formed, on a transparent substrate; and
(2) a step of forming the picture element part on the picture element part forming portion on the transparent substrate.

20. The process for producing a color filter according to claim 19, wherein the wettability on the transparent substrate is less than 10 degrees as the contact angle with a liquid having the surface tension of 40 mN/m.

21. The process for producing a color filter according to claim 19, wherein the step of coloring the exposed part for the picture element part with the ink jet system uses a UV-curing ink.

* * * * *